(12) United States Patent
Ge

(10) Patent No.: US 9,356,445 B2
(45) Date of Patent: May 31, 2016

(54) COMPACT TYPE FUEL CELL SUPPLY SYSTEM

(71) Applicant: INFINTIUM FUEL CELL SYSTEMS (SHANGHAI) CO., LTD., Shanghai (CN)

(72) Inventor: Xuxu Ge, Shanghai (CN)

(*) Notice: Subject to any disclaimer, the term of this patent is extended or adjusted under 35 U.S.C. 154(b) by 41 days.

(21) Appl. No.: 14/366,011

(22) Filed: Jun. 17, 2014

(65) Prior Publication Data

US 2015/0295401 A1  Oct. 15, 2015

Related U.S. Application Data

(63) Continuation of application No. PCT/CN2013/083379, filed on Sep. 12, 2013.

(30) Foreign Application Priority Data

Sep. 28, 2012 (CN) .......................... 2012 1 0367280

(51) Int. Cl.
*B60K 3/00* (2006.01)
*H02J 1/00* (2006.01)
(Continued)

(52) U.S. Cl.
CPC ............... *H02J 1/00* (2013.01); *B60L 11/1887* (2013.01); *B60R 16/02* (2013.01); *G01R 31/3648* (2013.01); *G05B 15/02* (2013.01); *H01M 8/0491* (2013.01); *H01M 8/04626* (2013.01);
(Continued)

(58) Field of Classification Search
CPC ...... H02J 1/00; H02J 7/0054; G01R 31/3648; B60R 16/02; G05B 15/02; H01M 16/006; H01M 2250/20; Y02T 10/7077; B60Y 2200/15; B60L 11/1896
USPC ............... 187/65.265, 65.1, 65.31, 68.5, 222; 429/513; 307/31
See application file for complete search history.

(56) References Cited

U.S. PATENT DOCUMENTS

| 4,839,246 A | * | 6/1989 | Takabayashi | ..... | H01M 8/04589 429/430 |
| 4,839,574 A | * | 6/1989 | Takabayashi | ..... | H01M 8/04589 320/101 |

(Continued)

*Primary Examiner* — Rexford Barnie
*Assistant Examiner* — Elim Ortiz
(74) *Attorney, Agent, or Firm* — John Lindsay

(57) ABSTRACT

This invention provides a kind of compact type fuel cell supply system, consisting of fuel cell, DCDC converting unit, contactor, energy storage device, controller, auxiliary system, power supply output end, operation control unit, with the contactor being a normal open type high-current contactor, the output end of the fuel cell connecting the input end of DCDC converting unit, the DCDC converting unit connecting the energy storage device through the contactor, the output end of DCDC converting unit also connecting the power supply output end and the high-power auxiliary component that the auxiliary system contains, the port of the energy storage device connecting the power supply output end and auxiliary system through the contactor, the operation control unit connecting the energy storage device, DCDC converting unit, controller respectively, the controller connecting the fuel cell, DCDC converting unit, the control end of contactor, the energy storage device and the auxiliary system respectively. This invention, through reducing parts and components, improves system reliability and decreases the volume to make a system have a sufficient space for installation and maintenance, which favors heat dissipation of electronic parts and components. This invention is applicable to forklift in particular.

8 Claims, 17 Drawing Sheets

(51) Int. Cl.
  *B60L 11/18* (2006.01)
  *H01M 16/00* (2006.01)
  *B60R 16/02* (2006.01)
  *G01R 31/36* (2006.01)
  *G05B 15/02* (2006.01)
  *H02J 7/00* (2006.01)
  *H01M 8/04* (2016.01)
  *H01M 8/24* (2016.01)

(52) U.S. Cl.
  CPC ........... *H01M16/006* (2013.01); *H02J 7/0054* (2013.01); *B60L 11/1896* (2013.01); *B60L 2210/10* (2013.01); *B60L 2240/52* (2013.01); *B60Y 2200/15* (2013.01); *H01M 8/04895* (2013.01); *H01M 8/2475* (2013.01); *H01M 2250/20* (2013.01); *Y02E 60/50* (2013.01); *Y02T 10/7077* (2013.01); *Y02T 10/7216* (2013.01); *Y02T 90/32* (2013.01); *Y02T 90/34* (2013.01)

(56) References Cited

U.S. PATENT DOCUMENTS

| | | | | |
|---|---|---|---|---|
| 4,883,724 A | * | 11/1989 | Yamamoto | B60L 11/185 429/431 |
| 5,678,410 A | * | 10/1997 | Fujita | B60H 1/00007 165/104.12 |
| 5,986,416 A | * | 11/1999 | Dubois | B62D 5/065 318/113 |
| 6,215,272 B1 | * | 4/2001 | Ohara | H01M 8/04298 320/103 |
| 6,369,461 B1 | * | 4/2002 | Jungreis | H01M 16/003 307/23 |
| 6,577,026 B1 | * | 6/2003 | Faller | B60L 11/1851 307/10.1 |
| 7,000,716 B2 | * | 2/2006 | Leifert | B60K 1/04 180/65.1 |
| 7,207,405 B2 | * | 4/2007 | Reid | B60K 1/04 180/65.1 |
| 7,374,004 B2 | * | 5/2008 | Kraimer | B60K 1/04 180/65.1 |
| 8,455,147 B2 | * | 6/2013 | Tanaka | H01M 8/04753 429/427 |
| 8,887,848 B2 | * | 11/2014 | Ishizuka | B66F 9/07595 180/65.1 |
| 2001/0053950 A1 | * | 12/2001 | Hasegawa | B60L 11/1881 701/22 |
| 2003/0091882 A1 | * | 5/2003 | Schmidt | H01M 8/0432 429/430 |
| 2003/0105562 A1 | * | 6/2003 | Hsiao | B60L 11/1887 701/22 |
| 2004/0129466 A1 | * | 7/2004 | Leifert | B60K 1/04 180/65.25 |
| 2006/0280977 A1 | * | 12/2006 | Sakajo | B60L 11/1885 429/429 |
| 2007/0026273 A1 | * | 2/2007 | Okamoto | H01M 8/04097 429/414 |
| 2009/0148736 A1 | * | 6/2009 | Manabe | B60L 11/1881 429/442 |

* cited by examiner

COMPACT TYPE FUEL CELL SUPPLY SYSTEM

PRIORITY

The present invention claims priority to PCT patent application PCT/CN2013/083379, which has a filing date of Sep. 12, 2013. The present invention claims priority to Chinese patent application 201210367280, which has a filing date of Sep. 28, 2012.

FIELD OF THE INVENTION

This invention relates to the new energy field, specifically to compact type fuel cell supply system.

BACKGROUND

When a fuel cell vehicle works, the hydrogen as a fuel has a chemical reaction with the atmospheric oxygen in the fuel cell on board the vehicle to generate electric power to start the motor and drive the vehicle; in addition to electricity, the chemical reaction of this category only generates water, therefore, fuel cell vehicles are called "real environmentally friend vehicle". Besides, the energy conversion efficiency of a fuel cell is 2~3 times higher than an internal combustion engine. Therefore, fuel cell vehicle is ideal in respect of both energy utilization and environmental protection.

In recent years, fuel cell vehicle has made a more important progress. Such world-renowned auto-makers as Daimler Chrysler, Ford, Toyota and General Motors Corporation have entered into the fuel cell vehicle manufacturing field one after another; as a result, the technology of fuel cell on board vehicle has had a remarkable advancement.

In view of many advantages of fuel cell over internal combustion engine, engineers have tried to apply fuel cells in multiple means of transportation for energy supply, however, a pity is that such application has only succeeded in such large vehicles as car, bus, etc. but in such small vehicles as forklift, etc., there has been almost no rational scheme.

Through retrieving existing open literatures, an invention patent of China called "a kind of energy mixed type power system for fuel cell vehicle" with application number "200610011555.1" has the following problems:

1. In addition to a battery pack supplying power to the power system, an additionally configured 24V battery is needed for starting. To charge the 24V battery, a 24 VDC/DC converter is additionally provided; as a result, the system has a lot of parts and possible failure points and at the same time, there are many lines that the parts correspond to, which occupy a lot of space, and the system volume can not be reduced.

2. The controller for a whole vehicle is always connected to the 24V battery and through the 24V battery, the power it needs is supplied; therefore, the controller for a whole vehicle is always in a running condition, as a result, the energy consumption of the system is high.

3. The controller for a whole vehicle controls through a key signal the supply of power by the high-power relay K2 to the fuel cell auxiliary system, starts the fuel cell; after starting, switches to supply of power by the high-power relay K1 to the fuel cell auxiliary equipment through the fuel cell; too many relays result in system being trivial and the volume being unable to be reduced.

4. Adopt scattered fuel cell controller, whole vehicle controller, battery energy management system; each device needs an enclosure protection and this causes a big volume; the devices needs lines to connect between them, resulting in a lot of harnesses; all these are not favorable to a compact system volume.

5. The fuel cell auxiliary system gets electricity from the fuel cell directly. As the voltage fluctuation range of fuel cell is large, a customized controller or power supply is needed to supply power to the auxiliary system; this will cause the system to have a high cost.

When adopting a similar trivial system in the above patent to design a forklift fuel cell system, the designed system will require redesign of forklift. For example, such two patent literatures as the American patent literature called "FUEL CELL INDUSTRIAL VEHICLE" with publication number "US2009236182A1" and the Canadian patent literature called "FUEL CELL INDUSTRIAL VEHICLE" with publication number "CA2659135A1" have publicized design schemes requiring re-manufacturing of forklift, as the lead-acid battery can not be replaced directly without modifying a forklift system.

Besides, the fuel cell system design that can be put directly in a forklift in the existing technology is bulky and miscellaneous. Feedback from users shows a high failure rate and it is troublesome to maintain. Around parts and components, there is no space for disassembly, maintenance operation. Those parts needing no maintenance have to be removed first to vacate the space to remove those parts needing maintenance. Around electronic control components, there is no space and this will influence heat dissipation. Insufficient heat dissipation will cause electronic parts and components to reduce in performance and even fail. As a result, the reliability, stability of system is seriously influenced.

SUMMARY

Aimed at the defects in the existing technology, the purpose of this invention is to provide a kind of compact type fuel cell supply system.

According to one aspect of this invention, it provides a kind of compact type fuel cell supply system, which consists of fuel cell, DCDC converting unit, contactor, energy storage device, controller, auxiliary system, is characterized by also including power supply output end, operation control unit, in which the said contactor is a normal open type high-current contactor, the said DCDC converting unit including the DCDC converter and high-power diode connecting with it, the output end of the said fuel cell connecting the input end of the said DCDC converting unit, the DCDC converting unit connecting through the said contactor the said energy storage device, the output end of the said DCDC converting unit also connecting the said power supply output end and the high-power auxiliary components that the said auxiliary system contains, the port of the said energy storage device connecting through the said contactor the said power supply output end and auxiliary system, the said operation control unit connecting respectively the said energy storage device, DCDC converting unit, controller, the said controller connecting respectively the said fuel cell, DCDC converting unit, the control end of contactor, energy storage device, auxiliary system, the said operation control unit being used to receive operation signal and supplying power for the said controller and DCDC converting unit, the said controller being used to receive the operation instructions generated by the said operation control unit according to the said operation signals and controlling according to the said operation instructions the said contactor, DCDC converting unit, auxiliary system, the said controller being also used to measure the state parameters of the said fuel cell, measure the state parameters of the said energy storage device, measure state parameters of the said auxiliary system and receive the state data of the said DCDC converting unit.

Preferably, the output end of the said fuel cell connects the input end of the said DCDC converter, the positive pole of the output end of the said DCDC converter connects the positive pole of the said high-power diode, the negative pole of the said high-power diode connects through the said contactor the said energy storage device, the said DCDC converter connects the said controller and is controlled by the said controller, the said DCDC converter connects the said operation control unit and receives the power supplied by the said operation control unit.

Preferably, the said high-power diode is placed on the heat dissipation passage of the said DCDC converter.

Preferably, the monitoring display is also included, with the said monitoring display connecting the said controller.

Preferably, an ON and OFF button is also included, with the said ON and OFF button connecting respectively the said operation control unit and controller.

Preferably, a remote control is also included, with the said remote control connecting in a radio mode the said operation control unit.

Preferably, an emergency stop button is also included, with the said emergency stop button connecting the said operation control unit.

Preferably, the said operation control unit changes the electric connection state with the said DCDC converting unit and controller according to the startup operation signal received.

Preferably, the state data of the said DCDC converting unit includes DCDC input current, DCDC input voltage.

Comparing with the existing technology, this invention has the following beneficial effects:

1. Through a compact design layout, the fuel cell supply system in this invention omits the 24V battery, 24V DC/DC converter and 1 switch as compared with the existing technology (for example, the invention patent application of China with application number "200610011555.1"). Thus, through reduction in parts and components and corresponding lines, the system reliability is improved; the volume reduction allows the system to have a sufficient space for installation and maintenance and favors heat dissipation from the electronic parts and components; further increases the reliability, stability of the system; at the same time, reduces the costs.

2. The input end of DCDC converter connects directly to the output end of the fuel cell. Therefore, the input voltage of the DCDC converter is the output voltage of the fuel cell; at this time, it is not necessary to provide an output voltage measurement device at the fuel cell output end as the tradition design does, and the output voltage of the fuel cell can be obtained through the input voltage measurement module in the DCDC converter and that output voltage can be delivered to the controller through the CAN communication module in the DCDC converter. In this way, the voltage measurement devices and connecting lines are reduced to save space, reduce energy consumption and costs;

3. The input end of the DCDC converter connects directly to the output end of the fuel cell, therefore, the input current of the DCDC converter is the output current of the fuel cell; at this time, it is not necessary to provide an output current measurement device at the fuel cell output end as the traditional design does, and the output current of the fuel cell can be obtained through the input current measurement module in the DCDC converter, and the output current can be delivered to the controller through the CAN communication module in the DCDC converter. In this way, the current measurement devices and connecting lines are reduced to save space, reduce energy consumption and costs. For example, the technical scheme publicized by the patent application of China with patent application number "200610011555.1" needs to provide a corresponding current measurement device at the fuel cell output end, because the auxiliary system gets power from the fuel cell directly and the DCDC converter will be unable to collect the output current of the fuel cell.

4. The high-power auxiliary component connects to the DCDC converting unit output end, through contactor, it can simultaneously connect with the energy storage device (the energy storage device can be battery or super capacitor). Such a structure can realize supply of power by the DCDC converting unit to the high-power auxiliary components when the system is working with the DCDC converting unit output voltage being higher than the output voltage of the energy storage device; on the contrary, power is supplied by the energy storage device to the high-power auxiliary components. As the output voltages of both DCDC converting unit and energy storage device are stable, the high-power auxiliary components can have a comparatively stable power supply with the voltage fluctuation range being far less than the fuel cell. Therefore, it is not necessary to convert the power supply voltage inputting into the high-power auxiliary components, it is not necessary to use customized parts and components, as a result, the working efficiency and service life of the high-power auxiliary component is improved at the same time of saving costs;

5. The controller is one with an integrated design; the integrated design reduces enclosures, shortens lines. Besides, in this invention, the system controller is only in an operation state when the system is working. There is no such problem as high system energy consumption resulting from the controller being always in an operation state in the technical scheme publicized by the contrast patent literature with application number "200610011555.1";

6. Being different from the contrast patent literature with application number "200610011555.1", the high-power diode in this invention is provided at the positive pole of the output end of the DCDC converter, as a result, it can further protect the DCDC converter on basis of protecting the fuel cell.

BRIEF DESCRIPTION OF THE DRAWINGS

By reading and referring to the detailed descriptions made to the non-restrictive embodiment examples by the following attached figures, other characteristics, purposes and advantages of this invention will become more evident.

DETAILED DESCRIPTION

A detailed description to this invention is to be made below by combining with specific embodiment examples. The following embodiment examples will help the technical personnel in this field further understand this invention, but it does not limit this invention in any form. It should be pointed out that for ordinary technical people in this field, adjustments and changes can also be made under the prerequisite of not being divorced from the conceiving of this invention. All these belong to the protection scope of this invention.

Figure 1:
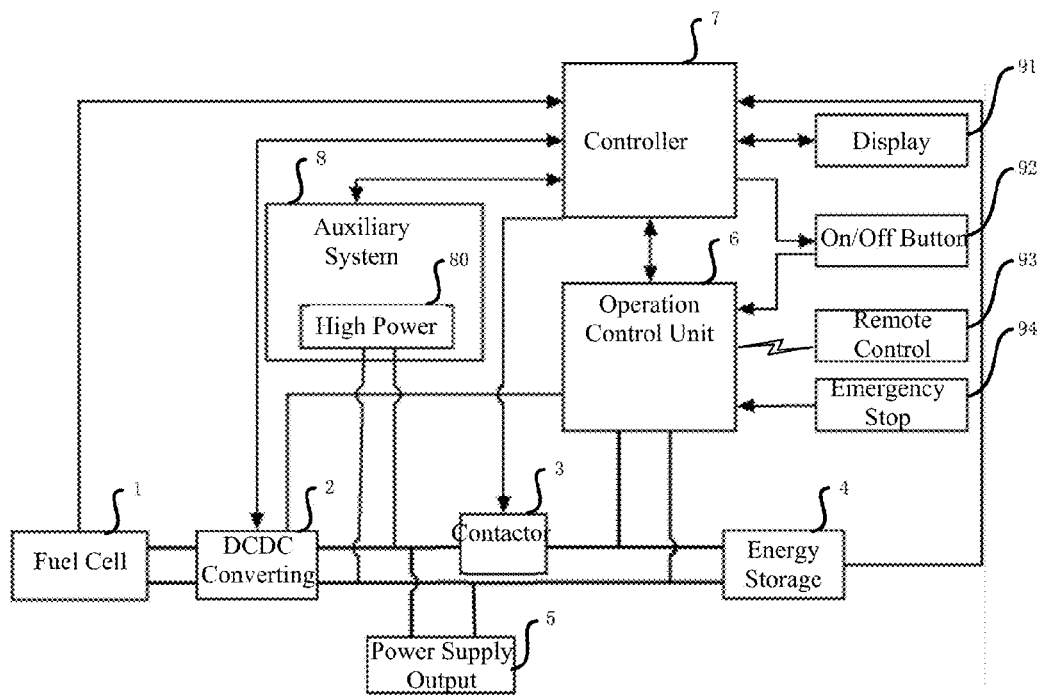
FIG. 1 is the schematic diagram of the structure of the compact type fuel cell supply system of the first embodiment example provided according to this invention.

FIG. 1 is the schematic diagram of the structure of the compact type fuel cell supply system of the first embodiment example provided according to this invention, in this embodiment example, the said compact type fuel cell supply system consists of fuel cell 1, DCDC converting unit 2, contactor 3, energy storage device 4, power supply output end 5, operation control unit 6, controller 7, auxiliary system 8, in which the said contactor 3 is a normal open type high-current contactor, the said DCDC converting unit 2 includes DCDC converter 21 and high-power diode 22 connecting with it.

Specifically, the output end of the said fuel cell 1 connects the input end of the said DCDC converting unit 2, DCDC converting unit 2 connects through the said contactor 3 the said energy storage device 4, the output end of the said DCDC converting unit 2 also connects the said power supply output end 5 and the high-power auxiliary component 80 that the said auxiliary system 8 contains, the port of the said energy storage device 4 connects through the said contactor 3 the said power supply output end 5 and auxiliary system 8, the said operation control unit 6 connects respectively the said energy storage device 4, DCDC converting unit 2, controller 7, the said controller 7 connects respectively the said fuel cell 1, DCDC converting unit 2, the control end of contactor 3, energy storage device 4 and auxiliary system 8.

In this embodiment example, the positive pole of the output end of the said DCDC converting unit 2 connects through the said contactor 3 the positive pole of the said energy storage device 4, the negative pole of the output end of the said DCDC converting unit 2 connects through the said contactor 3 the negative pole of the said energy storage device 4, the positive pole of the said energy storage device 4 connects through the said contactor 3 the positive pole of the said power supply output end 5 and the positive pole of auxiliary system 8, the negative pole of the said energy storage device 4 connects directly the negative pole of the said power supply output end 5 and the negative pole of auxiliary system 8; and in a variation of this embodiment example, the difference from the first embodiment example as shown in FIG. 1 is that in this variation, the change of the said contactor 3 in connecting position is: the said contactor 3 is connected between the negative pole of the output end of the said DCDC converting unit 2 and the negative pole of the said energy storage device 4, and the positive pole of the output end of the said DCDC converting unit 2 and the positive pole of the said energy storage device 4 are connected directly between them, correspondingly, the positive pole of the said energy storage device 4 connects directly the positive pole of the said power supply output end 5 and the positive pole of auxiliary system 8, the negative pole of the said energy storage device 4 connects through the said contactor 3 the negative pole of the said power supply output end 5 and the negative pole of auxiliary system 8. The technical people in this field understand that the two connection modes for contactor 3 as described in this natural paragraph can both realize "DCDC converting unit 2 connecting through the said contactor 3 the said energy storage device 4" and "the port of the said energy storage device 4 connecting through the said contactor 3 the said power supply output end 5 and auxiliary system 8".

The said auxiliary system 8 consists of air supply system, cooling system, hydrogen system, hydrogen safety system, the said high-power auxiliary component 80 refers to a high-power component in the auxiliary system (for example, fan, pump, heat dissipation fan). The technical people in this field can refer to the existing technology to accomplish the said auxiliary system 8 and its high-power auxiliary component 80. No unnecessary detail is to be given here.

The said operation control unit 6 is used to receive operation signals and supplies power for the said controller 7 and DCDC converting unit 2, the said controller 7 is used to receive the operation instructions generated by the said operation control unit 6 according to the said operation signals and control according to the said operation instructions the said contactor 3, DCDC converting unit 2, auxiliary system 8, the said controller 7 is also used to measure the state parameters of the said fuel cell 1, measure the state parameters of the said energy storage device 4, measure the state parameters of the said auxiliary system 8 and receive the state data of the said DCDC converting unit 2. The said DCDC converter 21 consists of CAN communication module, input voltage measurement module, input current measurement module, output voltage measurement module, output current measurement module. Preferably, DCDC converter 21 can control according to the communication data of the CAN communication module the specific numerical values of the output current, voltage; also outputs through the CAN communication module such data as input voltage, input current, output voltage, output current, etc. The state data of the said DCDC converting unit 2 includes DCDC input current, DCDC input voltage.

The said controller 7 is a controller with an integrated design, which is equivalent to the scattered fuel cell controller, whole vehicle controller, battery energy management system in the invention patent application of China with patent application number "200610011555.1"; further specifically, the said controller 7 can consist of energy management unit, fuel cell control unit, energy storage device monitoring unit, hydrogen safety monitoring unit, system failure monitoring unit and startup control unit.

Figure 2:
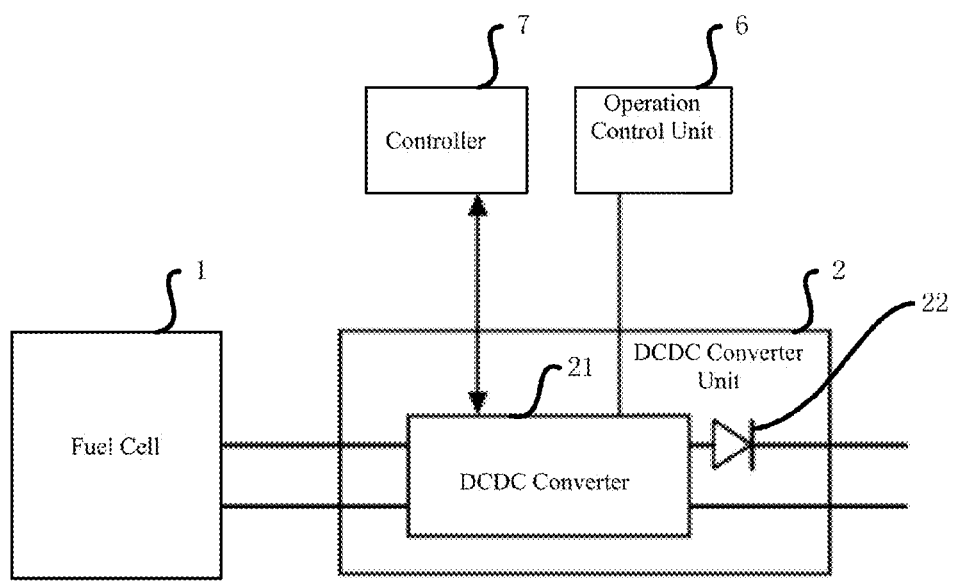
FIG. 2 is the specific structural schematic diagram of the DCDC converting unit in the compact type fuel cell supply system as shown in FIG. 1.

More specifically, as shown in FIG. 2, the output end of the said fuel cell 1 connects the input end of the said DCDC converter 21, the positive pole of the output end of the said DCDC converter 21 connects the positive pole of the said high-power diode 22, negative pole of the said high-power diode 22 connects through the said contactor 3 the said energy storage device 4, the said DCDC converter 21 connects the said controller 7 and is controlled by the said controller 7, the said DCDC converter 21 connects the said operation control unit 6 and receives the power supplied by the said operation control unit 6. And in a variation of this embodiment example, the difference from the first embodiment example as shown in FIG. 2 is that in this variation, the positive pole of the output end of the said fuel cell 1 connects the positive pole of the said high-power diode 22, the negative pole of the said high-power diode 22 connects the positive pole of the input end of the said DCDC converter 21, the negative pole of the output end of the said fuel cell 1 connects directly the negative pole of the input end of the said DCDC converter 21, the output end of the said DCDC converter 21 directly connects through the said contactor 3 the said energy storage device 4.

Further, in this embodiment example, the said compact type fuel cell supply system also consists of monitoring display 91, ON and OFF button 92, remote control 93, emergency stop button 94, in which the said monitoring display 91 connects the said controller 7, the said ON and OFF button 92 connects respectively the said operation control unit 6 and controller 7, the said remote control 93 connects in a radio mode the said operation control unit 6, the said emergency stop button 94 connects the said operation control unit 6. As shown in FIG. 1, when the said ON and OFF button 92 or remote control 93 gives a startup signal, the said operation control unit 6 supplies power to the said controller 7, the said controller 7 outputs a control signal to the contactor used as a switch to make it close, the said energy storage device 4 supplies power through the said contactor 3 to the said high-power auxiliary component 80, in the said auxiliary system 8, except the said high-power auxiliary component 80, other devices (for example, hydrogen system, hydrogen safety system) are supplied by the said controller 7, at the same time, the said controller 7 outputs signals to all modules constituting the said auxiliary system 8 to start the said fuel cell 1; after starting, the said contactor 3 maintains the state of connection at all times. By adopting this starting mode, it is not necessary to use additionally configured auxiliary battery and auxiliary DC/DC converter for charging, as a result, parts and components and corresponding lines are reduced, system reliability is improved, space is saved, system volume and costs are reduced.

Figure 3:
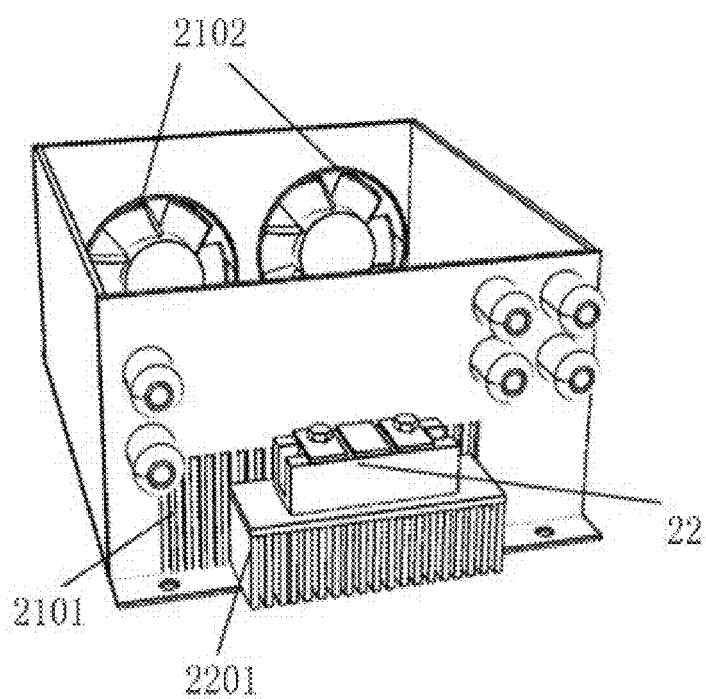
FIG. 3 shows the schematic diagram of the high-power diode position in the compact type fuel cell supply system of a preferable case of the first embodiment example provided according to this invention.

In a preferable case of this embodiment example, as shown in FIG. 3, the said high-power diode 22 is placed on the heat dissipation passage of the said DCDC converter 21, this can use the air discharged from the air duct 2101 by the heat dissipation fan 2102 contained by the said DCDC converter itself to dissipate heat from the said high-power diode 22, as a result, the heat dissipation fan on the heat dissipator 2201 (i.e. aluminum fin) for the said high-power diode is saved, the volume of heat dissipater is reduced, energy is saved, at the same time, the line to supply power to that heat dissipation fan is also saved. The said operation control unit 6 changes the electric connection state with the said DCDC converting unit and controller 7 according to the startup operation signal received. Thus, the said controller 7 is in an operation condition only when the system is working and will not lead to the problem of high system energy consumption due to being always in an operation condition.

Next, the system working principle is described through a preferable embodiment of this invention. Specifically, When the system is not started, the said operation control unit 6 and the said controller 7, DCDC converting unit 2 establish no electric connection state between them. When the button of the said remote control 93 or the said ON and OFF button 92 is depressed, the said operation control unit 6 and the said controller 7, DCDC converting unit 2 establish an electric connection between them, the said energy storage device 4 supplies power through the said operation control unit 6 to the said controller 7, the output signal of the said controller 7 drives the said contactor 3 to get connected, the said energy storage device 4 supplies power through the said contactor 3 to the said high-power auxiliary component 80, in the said auxiliary system 8, except the said high-power auxiliary component 80, other devices (for example, hydrogen system, hydrogen safety system) are supplied by the said controller 7, at the same time, the said controller 7 outputs working signals to all modules constituting the said auxiliary system 8 to start the said fuel cell 1; the said fuel cell 1 outputs power to the said DCDC converting unit 2, the said controller 7 controls according to the received state data signals of the said fuel cell 1, energy storage device 4, DCDC converting unit 2 the said DCDC converting unit 2 output current; under the normal system working condition, the output voltage of the said DCDC converting unit 2 is higher than the output voltage of the said energy storage device 4, the output current of the said DCDC converting unit 2 is output through the said power supply output end 5 to the small vehicle drive system carrying the said fuel cell supply system to drive the small vehicle to work, at the same time, the said DCDC converting unit 2 charges the said energy storage device 4, supplies power to the said high-power auxiliary component 80, operation control unit 6; when a small vehicle is in a high-power driving condition, the said power supply output end 5 needs to output high power, high currency, at this time, the said DCDC converting unit 2 output current is not sufficient to satisfy the requirements, the said energy storage device 4 will output current together with the said DCDC converting unit 2 to the small vehicle driving system carrying that fuel cell supply system through the said power supply output end 5 to drive that small vehicle to maintain the high-power driving condition; when the small vehicle is in a braking condition, the power energy recovered by the brake charges through the power supply output end the energy storage device.

When it is necessary to start the system, just depress the button of the said remote control 93 or the said ON and OFF button 92, in the meantime that the said operation control unit 6 and the said controller 7, DCDC converting unit 2 establish an electric connection, the said operation control unit 6 outputs a switch signal to the said controller 7, the said controller 7, after receiving the switch signal, outputs a signal to maintain power supply to the said operation control unit 6, so that the said operation control unit 6 and the said controller 7, DCDC converting unit 2 maintain an electric connection state; at the same time, the said controller 7 also drives the indicator light of the said ON and OFF button 92 to become on to prompt system starting; at this time, the button of the said remote control 93 or the said ON and OFF button 92 can be released.

When it is necessary to close the system, depress again the button of the said remote control 93 or the said ON and OFF button 92, the said operation control unit 6 outputs a switch signal to the said controller 7, the said controller 7, after receiving the switch signal, controls the indicator light of the said ON and OFF button 92 to blink (prompting switching off, at this time, the button of the said remote control 93 or the said ON and OFF button 92 can be released), the said controller 7 simultaneously controls the said auxiliary system 8 to stop working, and then stops outputting the signal to maintain power supply to the said operation control unit 6, so that the electric connection of the said operation control unit 7 and the said controller 7, DCDC converting unit 2 is disconnected; the whole system stops working.

When the said emergency stop button 94 is depressed, the electric connection between the said operation control unit 6 and the said controller 7, DCDC converting unit 2 get disconnected quickly to cut off the power supply to the whole system and make the system stop working.

The said monitoring display 91 gets power, communication data from the said controller 7, displays the system condition, failure information, etc. on the screen.

Next, a kind of fuel cell mixed power supply energy management method that can be achieved through this invention is shown through FIGS. 4 to 13.

The said fuel cell mixed power supply energy management method includes the following steps:

Step S201: Initialize, specifically, obtain the following parameter values first:

The first current setting of DCDC Isetmin,

The first voltage setting of energy storage device Umax,

The second voltage setting of energy storage device Umin,

The permissible DCDC current deviation value Ipermissible,

The maximum current setting that DCDC allows to output Imax,

Then let the current setting of DCDC Iset equal to the said first current setting of DCDC Isetmin;

Step S202: Obtain the energy storage device voltage Ustorage and the actual output current of DCDC converting unit Idcdc, calculate according to the following formula (1) DCDC current deviation value Ideviation:

$$Ideviation = Iset - Idcdc \qquad \text{Formula (1);}$$

Step S203: in case of meeting the following circumstances, enter into Step S204, Step S205 or Step S206:

If the energy storage device voltage Ustorage is greater than or equal to the first voltage setting of energy storage device Umax, then enter into Step S204, If the energy storage device voltage Ustorage is less than or equal to the first voltage setting of energy storage device Umin, then enter into Step S205, If the energy storage device voltage Ustorage is less than the first voltage setting of energy storage device Umax and greater than the first voltage setting of energy storage device Umin, and the DCDC current deviation value Ideviation is greater than or equal to the permissible DCDC current deviation value Ipermissible, then enter into Step S206, If the energy storage device voltage Ustorage is less than the first voltage setting of energy storage device Umax and greater than the first voltage setting of energy storage device Umin, and the DCDC current deviation value Ideviation is less than the permissible DCDC current deviation value Ipermissible, then enter into Step S207;

Step S204: If the current setting of DCDC Iset is greater than the first current setting of DCDC Isetmin, then gradually reduce the current setting of DCDC Iset, and then enter into Step S207; if the current setting of DCDC Iset is less than or equal to the first current setting of DCDC Isetmin, then let the current setting of DCDC Iset is equal to the said first current setting of DCDC Isetmin and then enter into Step S207;

Step S205: If the current setting of DCDC Iset is less than the maximum current setting that DCDC allows to output Imax, increase the current setting of DCDC Iset and then enter into Step S207; if the current setting of DCDC Iset is greater than or equal to the maximum current setting that DCDC allows to output Imax, let the current setting of DCDC Iset equal to the maximum current setting that DCDC allows to output Imax and then enter into Step S207;

Step S206: If the current setting of DCDC Iset is greater than the first current setting of DCDC Isetmin, reduce at a fastest speed the current setting of DCDC Iset and then enter into Step S207; if the current setting of DCDC Iset is less than or equal to the first current setting of DCDC Isetmin, let the current setting of DCDC Iset equal to the said first current setting of DCDC Isetmin and then enter into Step S207;

Step S207: Send a current setting instruction to DCDC converting unit, in which the said current setting instruction is used to set the output current of the DCDC converting unit as the current setting of DCDC Iset and then return to Step S202.

Preferably, before the said Step S201, the following steps executed in proper order are also included:

Step A1: Determine the limit voltage Ulim, specifically, judge if the highest limit of load protection voltage is greater than the charging protection voltage of the energy storage device; if the judgment result is positive, set the limit voltage Ulimit as equal to the charging protection voltage of the energy storage device; if the judgment result is negative, set the limit voltage Ulimit as equal to the highest limit of load protection voltage;

Step A2: Determine the expected DCDC converting unit output current Iexpect according to the following formula (2):

$$Iexpect = \frac{Irated \cdot Edcdc}{Ulim}, \qquad \text{Formula (2)}$$

Next, a kind of fuel cell mixed power supply energy management method that can be achieved through this invention is shown through FIGS. 4 to 13.

The said fuel cell mixed power supply energy management method includes the following steps:

Step S201: Initialize, specifically, obtain the following parameter values first:

The first current setting of DCDC Isetmin,

The first voltage setting of energy storage device Umax,

The second voltage setting of energy storage device Umin,

The permissible DCDC current deviation value Ipermissible,

The maximum current setting that DCDC allows to output Imax,

Then let the current setting of DCDC Iset equal to the said first current setting of DCDC Isetmin;

Step S202: Obtain the energy storage device voltage Ustorage and the actual output current of DCDC converting unit Idcdc, calculate according to the following formula (1) DCDC current deviation value Ideviation:

$$Ideviation = Iset - Idcdc \qquad \text{Formula (1);}$$

Step S203: in case of meeting the following circumstances, enter into Step S204, Step S205 or Step S206:

If the energy storage device voltage Ustorage is greater than or equal to the first voltage setting of energy storage device Umax, then enter into Step S204, If the energy storage device voltage Ustorage is less than or equal to the first voltage setting of energy storage device Umin, then enter into Step S205, If the energy storage device voltage Ustorage is less than the first voltage setting of energy storage device Umax and greater than the first voltage setting of energy storage device Umin, and the DCDC current deviation value Ideviation is greater than or equal to the permissible DCDC current deviation value Ipermissible, then enter into Step S206, If the energy storage device voltage Ustorage is less than the first voltage setting of energy storage device Umax and greater than the first voltage setting of energy storage device Umin, and the DCDC current deviation value Ideviation is less than the permissible DCDC current deviation value Ipermissible, then enter into Step S207;

Step S204: If the current setting of DCDC Iset is greater than the first current setting of DCDC Isetmin, then gradually reduce the current setting of DCDC Iset, and then enter into Step S207; if the current setting of DCDC Iset is less than or equal to the first current setting of DCDC Isetmin, then let the current setting of DCDC Iset is equal to the said first current setting of DCDC Isetmin and then enter into Step S207;

Step S205: If the current setting of DCDC Iset is less than the maximum current setting that DCDC allows to output Imax, increase the current setting of DCDC Iset and then enter into Step S207; if the current setting of DCDC Iset is greater than or equal to the maximum current setting that DCDC allows to output Imax, let the current setting of DCDC Iset equal to the maximum current setting that DCDC allows to output Imax and then enter into Step S207;

Step S206: If the current setting of DCDC Iset is greater than the first current setting of DCDC Isetmin, reduce at a fastest speed the current setting of DCDC Iset and then enter into Step S207; if the current setting of DCDC Iset is less than or equal to the first current setting of DCDC Isetmin, let the current setting of DCDC Iset equal to the said first current setting of DCDC Isetmin and then enter into Step S207;

Step S207: Send a current setting instruction to DCDC converting unit, in which the said current setting instruction is used to set the output current of the DCDC converting unit as the current setting of DCDC Iset and then return to Step S202.

Preferably, before the said Step S201, the following steps executed in proper order are also included:

Step A1: Determine the limit voltage Ulim, specifically, judge if the highest limit of load protection voltage is greater than the charging protection voltage of the energy storage device; if the judgment result is positive, set the limit voltage Ulimit as equal to the charging protection voltage of the energy storage device; if the judgment result is negative, set the limit voltage Ulimit as equal to the highest limit of load protection voltage;

Step A2: Determine the expected DCDC converting unit output current Iexpect according to the following formula (2):

$$I\text{expect} = \frac{I\text{rated} \cdot E\text{dcdc}}{U\lim}$$

Where Irated is the rated output power of the fuel cell, Edcdc is the efficiency of the DCDC converting unit;

Step A3:

On the current curve using expected DCDC converting unit output current as a constant charging value, obtain the corresponding charging capacity as 50%~90% of the voltage interval, select any voltage value in the voltage interval as the first voltage setting of energy storage device Umax.

Preferably, in the said Step A3, from the corresponding charging capacity being any voltage value or voltage interval below, set the said voltage value as or select any voltage value in the said voltage interval as the first voltage setting of energy storage device Umax:

The corresponding charging capacity is the voltage value at 90%, determine the voltage value at the said 90% as the first voltage setting of energy storage device Umax, The corresponding charging capacity is 60%~80% voltage interval, select any voltage value in the said 60%~80% voltage interval to be determined as the first voltage setting of energy storage device Umax, The corresponding charging capacity is 80%~90% voltage interval, select any voltage value in the said 80%~90% voltage interval to be determined as the first voltage setting of energy storage device Umax, The corresponding charging capacity is 50%~60% voltage interval, select any voltage value in the said 50%~60% voltage interval to be determined as the first voltage setting of energy storage device Umax.

Preferably, before the said Step S201, the following steps executed in proper order are also included:

Step B1: Determine the system limit charging current, specifically,

Under the working condition in which the system uses medium limit energy recovery, first use battery to make a braking action and obtain the system current, time data from braking to the end, the negative current of that system is the charging current, calculate the average of that charging current as the system limit charging current;

Step B2: Determine the limit voltage Ulim, specifically, judge if the highest limit of load protection voltage is greater than the charging protection voltage of the energy storage device; if the judgment result is positive, set the limit voltage Ulimit as equal to the charging protection voltage of the energy storage device; if the judgment result is negative, set the limit voltage Ulimit as equal to the highest limit of load protection voltage;

Step B3: Determine the expected DCDC converting unit output current Iexpect according to the following formula (2):

$$I\text{expect} = \frac{I\text{rated} \cdot E\text{dcdc}}{U\lim}$$

Where Irated is the rated output of the fuel cell, Edcdc is the efficiency of the DCDC converting unit;

Step B4: Inquire the testing curves of different charging currents and charging capacitances; according to the constant current charging curve that the system limit charging current corresponds to, obtain the corresponding charging capacitance when charging to the limit voltage; according to that charging capacity, look up the corresponding voltage value on the constant current charging curve that the expected DCDC converting unit output current Iexpect corresponds to, the said corresponding voltage value is the first voltage setting of energy storage device Umax;

Step B5: According to the energy recovery working condition when the system uses time limit, do actual testing by using the system controlled by the first voltage setting of energy storage device Umax, correct the first voltage setting of energy storage device Umax so that the actually measured highest voltage is slightly lower than the limit voltage Ulim;

Step B6: Correct the capacity of the energy storage device, specifically, according to the relational curve between energy storage device charging capacity/rated capacity and cycle times, or the relational curve between the discharging capacity/rated capacity and cycle times, inquire the charging capacity/rated capacity ratio after multiple cycles, and then take the product of the first voltage setting of energy storage device Umax and the charging capacity/rated capacity ratio as the corrected first voltage setting of energy storage device Umax.

Preferably, before the said Step S201, the following steps executed in proper order are also included:

Step C1: Determine the minimum consumption current of the auxiliary system Is, specifically, use the system controlled by the first voltage setting of energy storage device Umax to have the system be in an idle condition, after the system becomes stable, the consumption of the auxiliary system reduces to the minimum, measure the current of the auxiliary system at this time, which is the minimum consumption current;

Step C2: take the product of the minimum consumption current of the auxiliary system and the coefficient K as the first current setting of DCDC Isetmin, where the coefficient K is less than 1.

Preferably, the coefficient K is 0.6.

Preferably, before the said Step S201, the following steps executed in proper order are also included:

Step D1: Determine according to the follow formula (3) the maximum current setting that DCDC allows to output Imax:

$$Imax = \frac{Irated \cdot Edcdc}{Umax}$$

Preferably, before the said Step S201, the following steps executed in proper order are also included:

Step E1: Determine according to the following formula (4) the capacitance at the minimum load Cmin:

$$Cmin = C - (Is - I_{set\,min}) \cdot T$$

Where, C is the charging capacity, Is is the minimum consumption current of the auxiliary system, T is time, the said charging capacity is the charging capacity that the first voltage setting of energy storage device Umax corresponds to inquired on the charging capacity and charging voltage curve with constant current charging taking the maximum current setting that DCDC allows to output Imax as the current, the said time is set according to the response speed that the system requires;

Step E2: According to the capacitance at minimum load Cmin, inquire the charging voltage that the capacitance at the minimum load Cmin corresponds to on the charging capacity and charging voltage curve with constant current charging taking the maximum current setting that DCDC allows to output Imax as the current, select that charging voltage as the second voltage setting of energy storage device Umin.

The said fuel cell mixed power supply energy management method relates to fuel cell. Through retrieving existing technologies, the following literatures are retrieved:

The fuel cell power supply control principle publicized by the invention patent application of China called "power distribution method for fuel cell mixed power system" with application number "200310103253.3": Adopt SOC calculation to control according to measurement load control signal (such as throttle signal) and power cell SOC (state of charge) the output of the fuel cell DCDC to satisfy the energy demands of the load system, fuel cell system and power cell pack under the state of charge.

The fuel cell power supply control method publicized by the invention patent application of China called "fuel cell based mixed power device energy management system" with application number "201010108281.4" also adopts SOC calculation, where, Here is the calculation formula for the state of charge (SOC):

$$soc(k) = (BC \times soc(k-1) - \int_{k-1}^{k} i_{out} dt + \int_{k-1}^{k} i_{in} dt) / BC$$

In the above calculation formula, BC represents cell capacity, soc(k) represents the SOC value of cell at current moment, soc(k−1) represents the SOC value at the previous moment, iout represents cell discharging current and fin represents cell charging current.

It is know from the above formula that the SOC calculation is a kind of algorithm to obtain the state of charge (SOC) of battery according to the battery current data collected, the cell capacity data set, based on the integration algorithm and by correcting according to the actual cell capacity, cell voltage, temperature at the time of actual use. That invention application has the following disadvantages:

1. All the above control method relies on SOC calculation; and the SOC calculation relies on accurate current data, the accuracy of current data depends on the accuracy, sensitivity, stability of current measurement device; however, the current measurement device also has an error; therefore, the SOC calculation method can only be an approximate estimation of the state of charge of the energy storage device. The existing fuel cell system on board vehicle using the SOC calculating method adopts a dual-range current sensor in order to obtain a relatively accurate current value; however, a dual-range current sensor is unable to cover the whole range and at the same time is also unable to avoid the zero drift that the current sensor has, therefore, the current senor has to be calibrated frequently. In this circumstance, a fuel cell company, after selling a fuel cell system on board vehicle, has to calibrate regularly the current measurement device sensor. The product immaturity will directly influence the marketization progress of fuel cell vehicles.

2. The capacity of the energy storage device (battery) may reduce with use gradually. It is known from the formula that in order to obtain SOC accurately, it is imperative to have an accurate capacity value of the energy storage device. Therefore, it is imperative to calibrate the capacity of the energy storage device (battery), which can only be a vague estimation. Therefore, it is unable to accurately conduct the fuel cell system energy management by adopting the SOC calculation method.

3. The current output fluctuation amplitude is large when a forklift is working.

The voltage of the energy storage device (battery) used on fuel cell bus, fuel cell car as auxiliary power is often hundreds of volts, the current range is from negative tens of amperes to positive tens of amperes; under the circumstance that the current range is small, the accuracy of battery current value is relatively high, under this working condition, though the use of the SOC calculation method is not so good as the said fuel cell mixed power supply energy management method, it is barely satisfactory.

The voltage of the energy storage device (battery) used on fuel cell forklift as auxiliary power is often tens of volts, but the current range fluctuates largely. For example, the common nominal voltage 24V corresponds to a working current range −500~500A; the nominal voltage 36V corresponds to a working current range −800~1000 A, the nominal voltage 48V corresponds to a current range −600~800 A. This is because when a fuel cell forklift is working, it constantly lifts loads, drives at an accelerated speed, brakes, etc. that result in the output current of the battery increasing from several amperes gradually to hundreds of amperes and even a thousand amperes and turning from outputting a thousand amperes to inputting hundreds of amperes. As the current range is large, it is very difficult to measure the current value accurately; at the same time, that the current output fluctuation frequency is high when a forklift is working further makes real-time and accurate current measurement become very difficult; and SOC integration algorithm can also amplify the deviation constantly. Therefore, it is unable to realize an accurate fuel cell system energy management by adopting the SOC calculation method on a fuel cell forklift.

4. Energy recovery issue, protection issue.

When a fuel cell vehicle with an energy recovery system (such as the invention patent application called "power distribution method for fuel cell mixed power system" with application number "200310103253.3") brakes for energy recovery, the energy resulting from braking is input in the energy storage device with a current being often as high as hundred of amperes and even up to 1000 A in some cases, then the voltage of the energy storage device will increase sharply, at the same time, the internal resistances of cables, connections, relays, etc. in the circuits through which current passes at recovery braking can all cause the vehicle voltage to rise; if the battery voltage exceeds the protection voltage of the energy storage device, or the vehicle voltage exceeds the protection voltage of the vehicle, the system or vehicle may disconnect the relay making external connection to realize equipment protection. As a result of disconnecting the relay, the energy storage device is unable to continue to absorb the braking energy and braking can not proceed normally. The vehicle may be out of control and even have an accident. In order that at energy recovery, the voltage of the energy storage device does not exceed the protection voltage of the energy storage device, or the vehicle voltage does not exceed the protection voltage of the vehicle, it is imperative to control the actual state of charge (SOC) of the energy storage device to be a right or a lower value.

However, as the SOC calculation is based on the measured battery current value and the actual battery capacity and as the battery current data, the actual battery capacity can not be measured accurately, it results in the SOC calculation method being unable to obtain the actual SOC values. When the SOC measurement value is lower than the actual value, the actual state of charge (SOC) of the energy storage device is at a high value, the voltage of the energy storage device will exceed the protection voltage of the energy storage device or the protection voltage of the vehicle; this will constitute a safety hazard to the fuel cell vehicle.

The said fuel cell mixed power supply energy management method is to control the output current of the DCDC converting unit, respond to the energy demand resulting from load condition change and at the same time ensure the energy storage device to be in a best state of charge according to the measured voltage of the energy storage device and the actual current output by the DCDC converting unit under the circumstance without connecting the vehicle operation input signal (throttle, brake) and calculating SOC.

In comparison with the existing technology, the said fuel cell mixed power supply energy management method has the following beneficial effects:

1. Improve the fault-tolerant capability of the system. As the control method no longer adopts the SOC calculation mode, the system no longer relies on the accuracy, reliability of the current sensor.

2. Strong compatibility. By setting the charging current condition at a limit condition, the same system is applicable to more models of different vehicles (forklift) and no parameter correction is necessary.

3. High reliability. By setting parameters beforehand to correct in advance the reduction in batter capacity, the long-term system reliability is ensured. The said fuel cell mixed power supply energy management method also uses the data of the energy storage device in determining parameters. These data are that measured in laboratory under a stable working condition; and in the existing system using the SOC calculation mode, the data of the energy storage device is calculated on real-time basis when the system is working, which a kind of dynamic estimation with the accuracy is being not satisfactory.

4. Stable output voltage. The system controls the energy storage device voltage near the first voltage setting of energy storage device Umax, the second voltage setting of energy storage device Umin, this favors to extend the service life to use the vehicle equipment, the energy storage device.

5. Strong practicality. The said fuel cell mixed power supply energy management method is obtained by conducting a lot of actual tests and verifications on multiple models of forklift fuel cells and constant adjustment. A verification was also made on the fuel cell system of a tourist coach. It can not only be used on vehicles, but also adapts to a power supply system.

Figure 4:
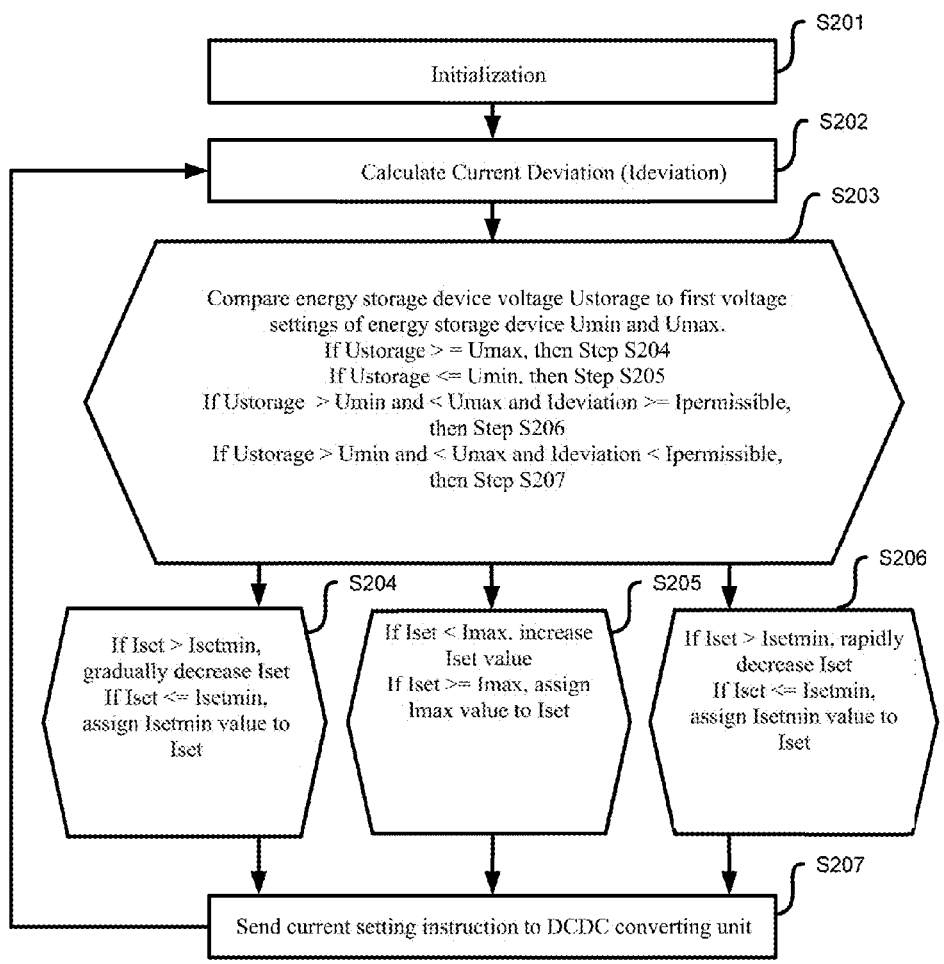
FIG. 4 is the general framework flow chart of the fuel cell mixed power supply energy management method.

More specifically, FIG. 4 is the general framework flow chart of the fuel cell mixed power supply energy management method, specifically, in this embodiment example, Step S201 is executed first to initialize, more specifically, to obtain the parameters set by the system, such parameters include the first current setting of DCDC Isetmin, the first voltage setting of energy storage device Umax, the second voltage setting of energy storage device Umin, the permissible DCDC current deviation value Ipermissible, the maximum current setting that DCDC allows to output Imax, and then let the current setting of DCDC Iset equal to the said first current setting of DCDC Isetmin, where the said energy storage device can be a high energy lithium ion cell and a high capacity super capacitor, etc.

Next Step S202 is executed to obtain the energy storage device voltage Ustorage and the actual output current of the DCDC converting unit Idcdc. The DCDC current deviation value Ideviation is calculated according to the following formula (1):

$$Ideviation = Iset - Idcdc \qquad \text{Formula (1)};$$

Then Step S203 is executed: enter into Step S204, Step S205 or Step S206 correspondingly if the following conditions are met:

- If the energy storage device voltage Ustorage is greater than or equal to the first voltage setting of energy storage device Umax, then enter into Step S204,
- If the energy storage device voltage Ustorage is less than or equal to the first voltage setting of energy storage device Umin, then enter into Step S205,
- If the energy storage device voltage Ustorage is less than the first voltage setting of energy storage device Umax and greater than the first voltage setting of energy storage device Umin, and the DCDC current deviation value Ideviation is greater than or equal to the permissible DCDC current deviation value Ipermissible, then enter into Step S206,
- If the energy storage device voltage Ustorage is less than the first voltage setting of energy storage device Umax and greater than the first voltage setting of energy storage device Umin, and the DCDC current deviation value Ideviation is less than the permissible DCDC current deviation value Ipermissible, then enter into Step S207;

In which for Step S204: if the current setting of DCDC Iset is greater than the first current setting of DCDC Isetmin, reduce gradually the current setting of DCDC Iset and then enter into Step S207; if the current setting of DCDC Iset is less than or equal to the first current setting of DCDC Isetmin, let the current setting of DCDC Iset equal to the said the first current setting of DCDC Isetmin and then enter into Step S207;

Step S205: If the current setting of DCDC Iset is less than the maximum current setting that DCDC allows to output Imax, increase the current setting of DCDC Iset and then enter into Step S207; if the current setting of DCDC Iset is greater than or equal to the maximum current setting that DCDC allows to output Imax, let the current setting of DCDC Iset equal to the maximum current setting that DCDC allows to output Imax and then enter into Step S207;

Step S206: If the current setting of DCDC Iset is greater than the first current setting of DCDC Isetmin, reduce at the fastest speed the current setting of DCDC Iset and then enter into Step S207; if the current setting of DCDC Iset is less than or equal to the first current setting of DCDC Isetmin, let the current setting of DCDC Iset equal to the said the first current setting of DCDC Isetmin and then enter into Step S207;

Step S207: Send a current setting instruction to DCDC converting unit, where the said current setting instruction is used to set the output current of the DCDC converting unit as the current setting of DCDC Iset and then return to Step S202.

FIGS. 5 to 8 show the flow charts of type 1 to type 4 fuel cell mixed power supply energy management methods. The technical people in this field can understand the embodiment examples as shown in FIGS. 5 to 8 as 4 preferable cases of the embodiment examples as shown in FIG. 4, specifically, such 4 preferable cases show 4 types of different embodiments of the said Step S203 in FIG. 4.

Figure 5:
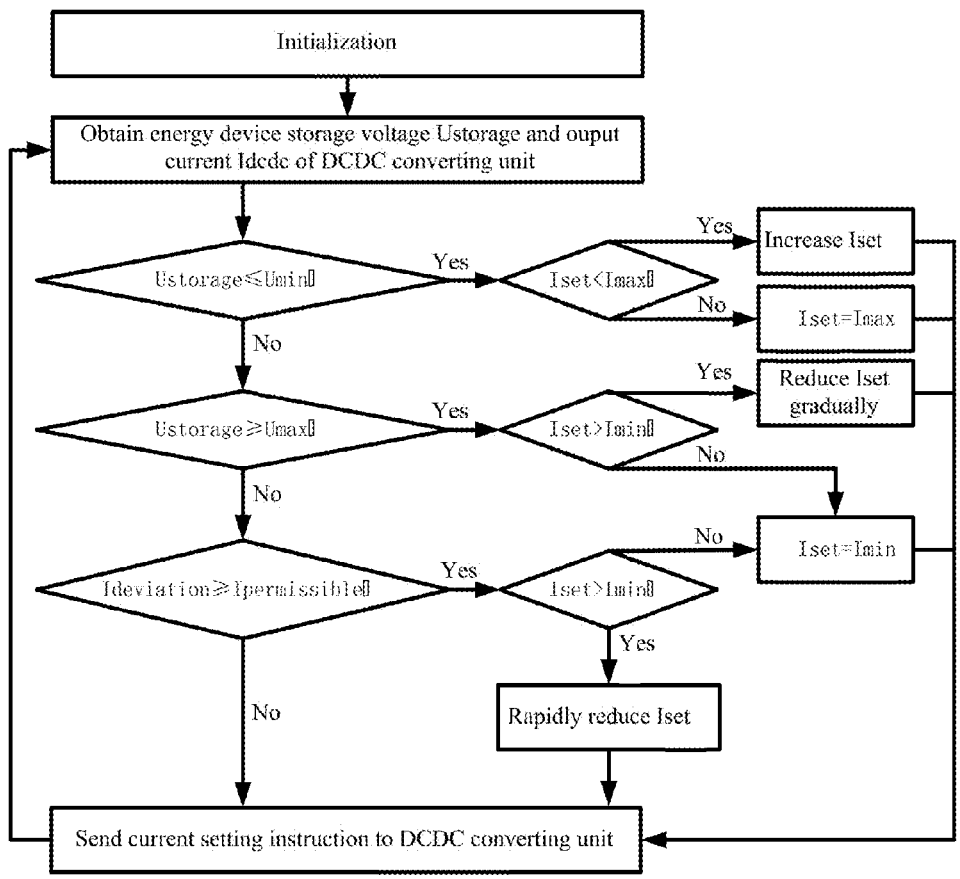
FIG. 5 is the flow chart of the first type of fuel cell mixed power supply energy management method.

For example, in FIG. 5, first judge if "the energy storage device voltage Ustorage is less than or equal to the first voltage setting of energy storage device Umin", if the judgment result is negative, judge "if the energy storage device voltage Ustorage is greater than or equal to the first voltage setting of energy storage device Umax" next, if the judgment result is negative again, then judge "if the DCDC current deviation value Ideviation is greater than or equal to the permissible DCDC current deviation value Ipermissible". In which, the technical people in this field understand that when the said energy storage device voltage Ustorage is greater than the first voltage setting of energy storage device Umax or less than the first voltage setting of energy storage device Umin, the DCDC current deviation value Ideviation is not greater than the permissible DCDC current deviation value Ipermissible.

Figure 6:
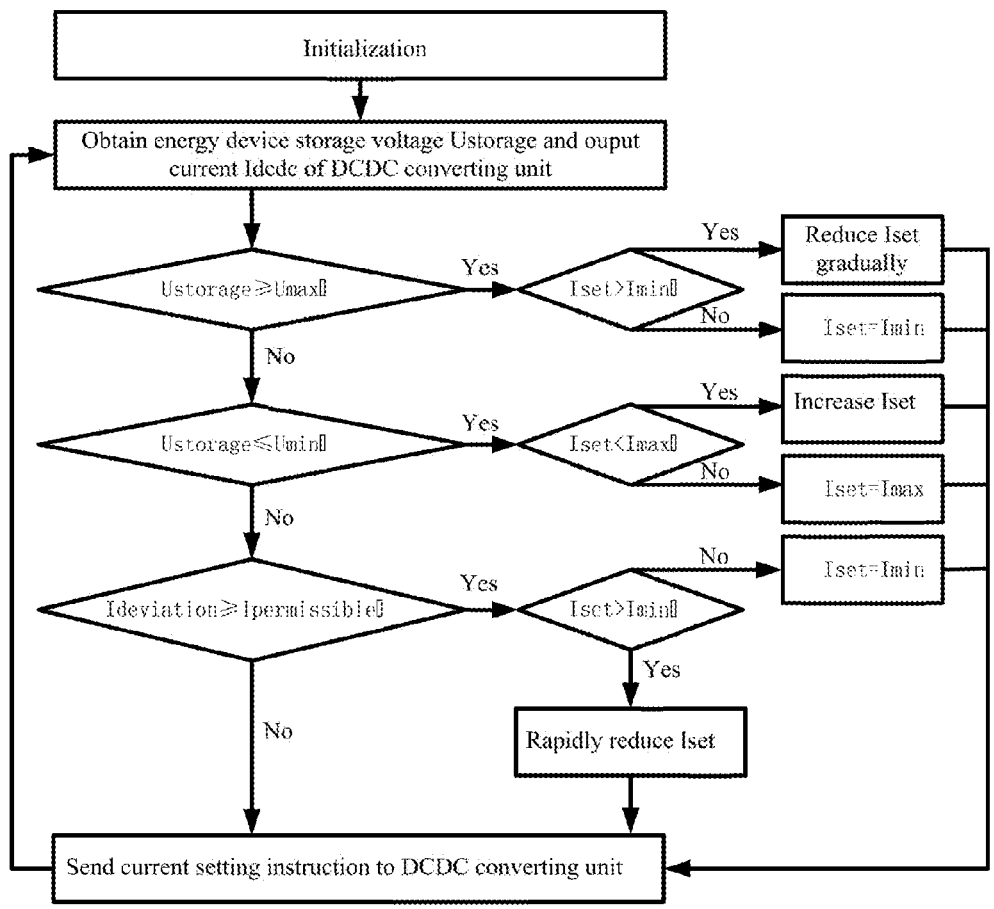
FIG. 6 is the flow chart of the second type of fuel cell mixed power supply energy management method.

Again for example, in FIG. 6, first judge "if the energy storage device voltage Ustorage is greater than or equal to the first voltage setting of energy storage device Umax", if the judgment result is negative, then judge "if the energy storage device voltage Ustorage is less than or equal to the first voltage setting of energy storage device Umin" next, if the judgment result is negative again, then judge "if the DCDC current deviation value Ideviation is greater than or equal to the permissible DCDC current deviation value Ipermissible".

Figure 7:
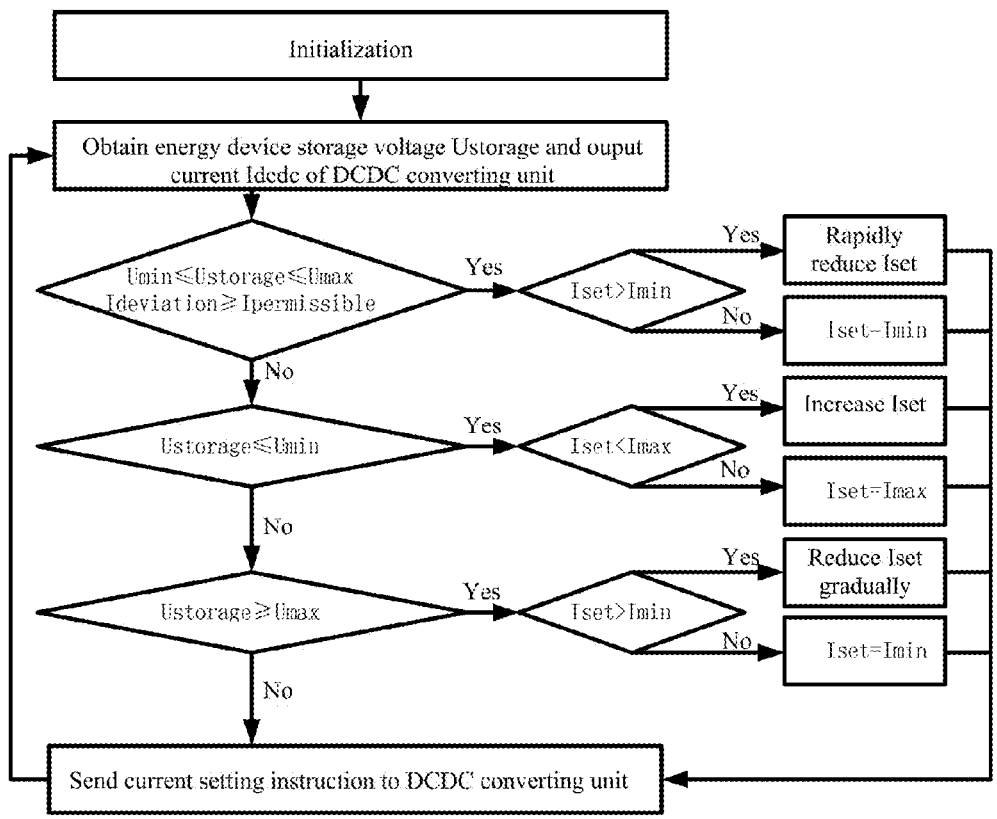
FIG. 7 is the flow chart of the third type of fuel cell mixed power supply energy management method.

Again for example, in FIG. 7, first judge "if the energy storage device voltage Ustorage is less than the first voltage setting of energy storage device Umax and greater than the first voltage setting of energy storage device Umin, and if the DCDC current deviation value Ideviation is greater than or equal to the permissible DCDC current deviation value Ipermissible", if the judgment result is negative, then judge "if the energy storage device voltage Ustorage is less than or equal to the first voltage setting of energy storage device Umin" next, if the judgment result is negative again, then judge "if the energy storage device voltage Ustorage is greater than or equal to the first voltage setting of energy storage device Umax".

Figure 8:
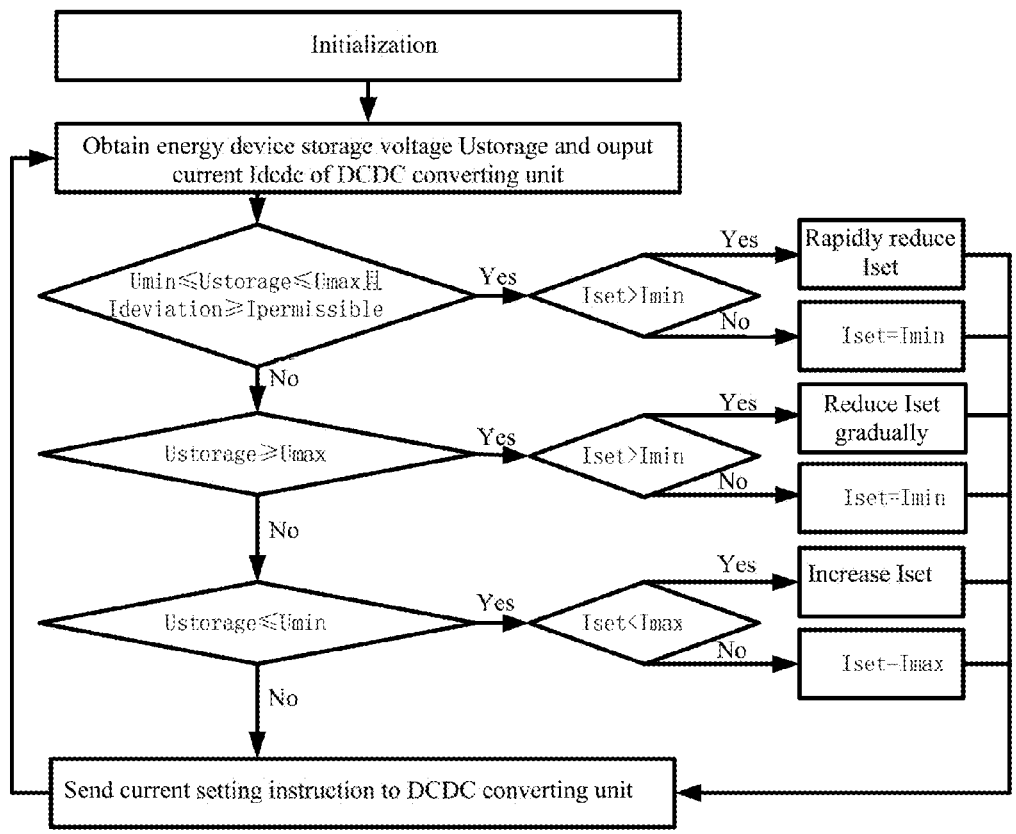
FIG. 8 is the flow chart of the fourth type of fuel cell mixed power supply energy management method.

Again for example, in FIG. 8, first judge "if the energy storage device voltage Ustorage is less than the first voltage setting of energy storage device Umax and greater than the first voltage setting of energy storage device Umin, and if the DCDC current deviation value Ideviation is greater than or equal to the permissible DCDC current deviation value Ipermissible", if the judgment result is negative, then judge "if the energy storage device voltage Ustorage is greater than or equal to the first voltage setting of energy storage device Umax" next, if the judgment result is negative again, then judge "if the energy storage device voltage Ustorage is less than or equal to the first voltage setting of energy storage device Umin".

In a preferable case of this embodiment example, before the said Step S201, parameters are determined in the following way: the first voltage setting of energy storage device Umax, the second voltage setting of energy storage device Umin, the permissible DCDC current deviation value Ipermissible and the maximum current setting that DCDC allows to output Imax.

A. In case of system having no energy recovery (adopt a mechanical brake, brake by using the friction between brake block and hub, consume the energy resulting from braking), the steps to determine the first voltage setting of energy storage device Umax are shown below:

Step A1: Determine the limit voltage Ulim, specifically, judge if the highest limit of load protection voltage is greater than the charging protection voltage of the energy storage device; if the judgment result is positive, set the limit voltage Ulimit as equal to the charging protection voltage of the energy storage device; if the judgment result is negative, set the limit voltage Ulimit as equal to the highest limit of load protection voltage; where, the load protection voltage is a range value, the charging protection voltage of the energy storage device is a numerical value, all of which are to be supplied by the supplier.

Step A2: Determine the expected DCDC converting unit output current Iexpect according to the following formula (2):

$$Iexpect = \frac{Irated \cdot Edcdc}{Ulim}$$

Figure 9:
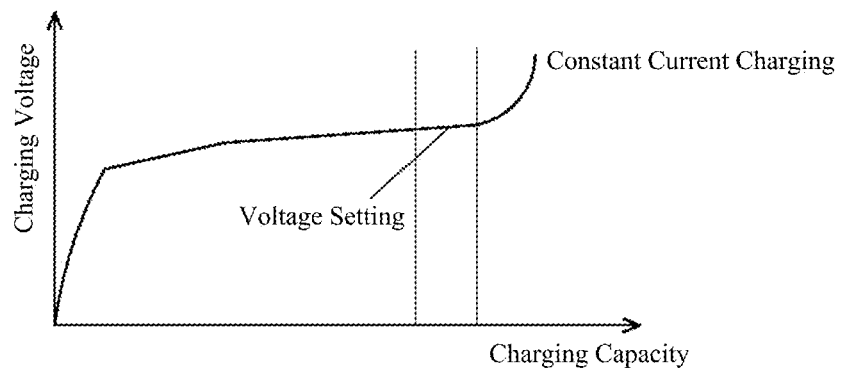
FIG. 9 is the schematic diagram of current curve of the DCDC converting unit output current with charging expected at a constant value.

Where, Irated is the rated output power of the fuel cell, Edcdc is the efficiency of the DCDC converting unit;

Step A3:

On the current curve using expected DCDC converting unit output current as a constant charging value, obtain the corresponding charging capacity as 50%~90% voltage interval, select any voltage value in that voltage interval as the first voltage setting of energy storage device Umax. Where, (the current curve with the said expected DCDC converting unit output current as a constant charging value can be supplied by the cell supplier, If there is no right data, approximate currents can be used for replacement, or the curve can be obtained by fitting according to the data at other currents. For example, the curve as shown in FIG. 9).

Further preferably, in the said Step A3, different charging capacities were selected according to different energy storage devices, different service life requirements. Specifically, from the corresponding charging capacity being as any following voltage value or voltage interval, determine the said voltage value as or select any voltage value of the said voltage interval as the first voltage setting of energy storage device Umax:

For a system with a super capacitor and fuel cell, the corresponding charging capacity is the voltage value at 90%, determine the voltage value at the said 90% as the first voltage setting of energy storage device Umax, For battery and fuel cell being used as a power system (for example, vehicle), the corresponding charging capacity is 60%~80% voltage interval, select any voltage value of the said 60%~80% voltage interval to be determined as the first voltage setting of energy storage device Umax;

For battery (with a poor high current discharing capacity) and fuel cell being used as a power system (for example, vehicle), the corresponding charging capacity is 80%~90% voltage interval, select any voltage value of the said 80%~90% voltage interval to be determined as the first voltage setting of energy storage device Umax, For battery and fuel cell being used as a non-power system (for example, a power supply for communication base), the corresponding charging capacity is 50%~60% voltage interval, select any voltage value of the said 50%~60% voltage interval to be determined as the first voltage setting of energy storage device Umax to maintain a super long service life.

Figure 10:
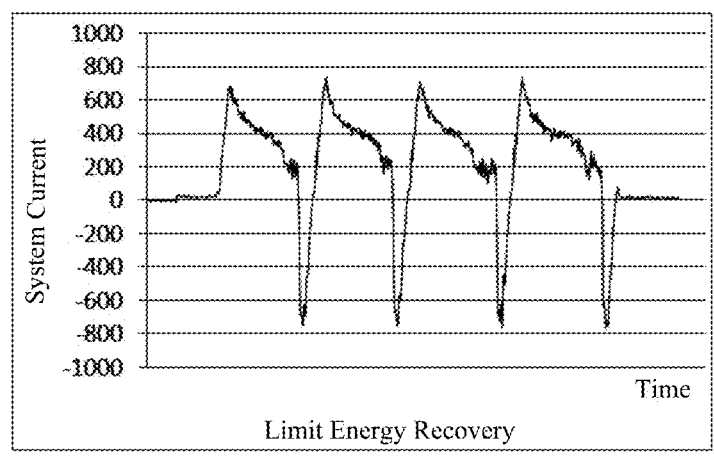
FIG. 10 is the system limit current test curve.

B. In case of a system with energy recovery, the steps to determine the first voltage setting of energy storage device Umax are shown below:

Step B1: Determine the system limit charging current, specifically, under the energy recovery working condition in which the system uses a medium limit (for example, a forklift brakes with the heaviest weight lifted, the highest slope (a permissible slope circumstance for forklift), accelerating down a slope to the end thereof), use batter first to make a braking action to obtain the system current, time data from braking until its end, as shown in FIG. 10, the negative current of that system is the charging current, calculate the average of that charging current as the system limit charging current;

Step B2: Determine the limit voltage Ulim, specifically, judge if the highest limit of load protection voltage is greater than the charging protection voltage of the energy storage device; if the judgment result is positive, then set the limit voltage Ulimit as equal to the charging protection voltage of the energy storage device; if the judgment result is negative, then set the limit voltage Ulimit as equal to the highest limit of load protection voltage;

Step B3: Determine according to the following formula (2) the expected DCDC converting unit output current Iexpect:

$$I\text{expect} = \frac{I\text{rated} \cdot E\text{dcdc}}{U\lim}$$

Figure 11:
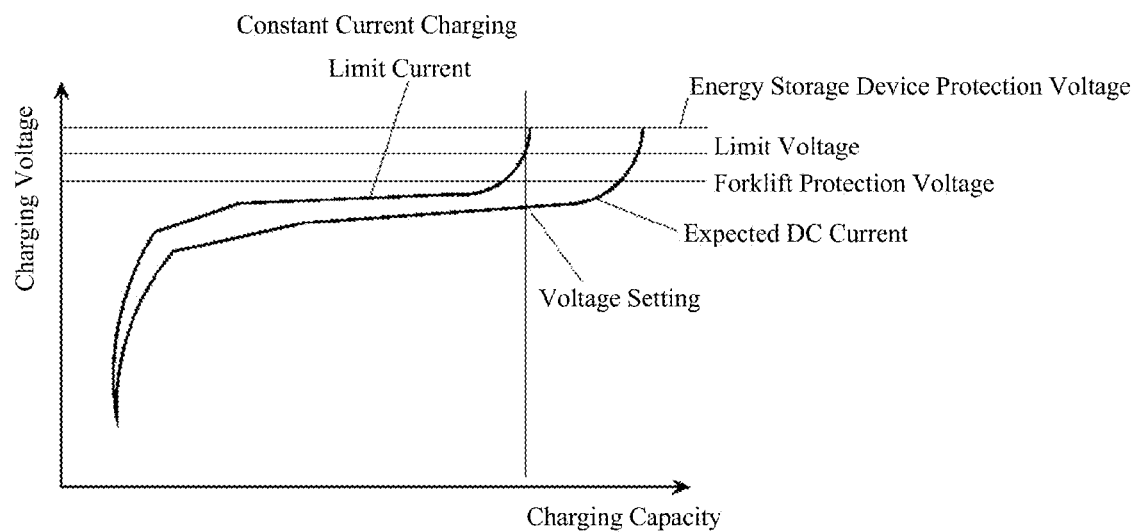
FIG. 11 is the schematic diagram for selecting the first voltage setting of energy storage device Umax.

Where, Irated is the rated output power of the fuel cell, Edcdc is the efficiency of the DCDC converting unit;

Step B4: Inquire the test curves with different charging currents and charging capacities; according to the constant current charging curve that the system limit charging current corresponds to, obtain the corresponding charging capacity when charging to the limit voltage; according to that charging capacity, find the corresponding voltage value on the constant current charging curve that the expected DCDC converting unit output current Iexpect corresponds to, the said corresponding voltage value is the first voltage setting of energy storage device Umax, as shown in FIG. 11; in which, the technical people in this field understand that the test curves with different charging currents and charging capacities (AH) can be obtained from the manufacturer.

Figure 12:
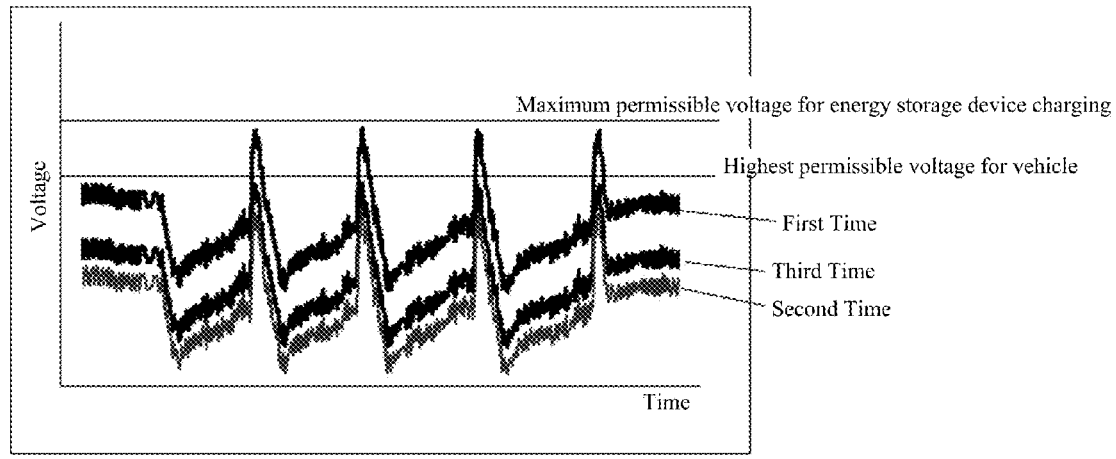
FIG. 12 is the schematic diagram for the process of correcting the first voltage setting of energy storage device Umax.

Step B5: According to the energy recovery working condition in which the system uses the time limit, conduct actual testing by using the system controlled by the first voltage setting of energy storage device Umax, correct the first voltage setting of energy storage device Umax so that the actually measured highest voltage is slightly lower than the limit voltage Ulim;

Step B6: Correct the capacity of the energy storage device, specifically, according to the relational curve between the charging capacity/rated capacity and cycle times of energy storage device, or the relational curve between the discharging capacity/rated capacity and cycle times thereof, inquire the charging capacity/rated capacity ratio after multiple cycles, and then take the product of the first voltage setting of energy storage device Umax and charging capacity/rated capacity ratio as corrected first voltage setting of energy storage device Umax, for example, as shown in FIG. 12.

Where, as a high current flows past, cable, contactor, cable connection, etc. may cause a voltage drop, which must be corrected. According to the energy recovery working condition in which the system uses time limit, conduct actual testing by using the system controlled by the first voltage setting of energy storage device Umax.

If the actually measured highest voltage is higher than the limit voltage, then a correction must be made.

If the actually measured highest voltage is much lower than the limit voltage, then a correction can also be made.

The correcting formula is:

Modified first voltage setting of energy storage device Umax=the first voltage setting of energy storage device Umax*before correction (limit voltage–the first voltage setting of energy storage device Umax before correction)/(actually measured highest voltage–the first voltage setting of energy storage device Umax).

By using the approximation method, gradually change the first voltage setting of energy storage device Umax to conduct testing, after measurement, the corrected first voltage setting of energy storage device Umax is obtained.

Figure 13:
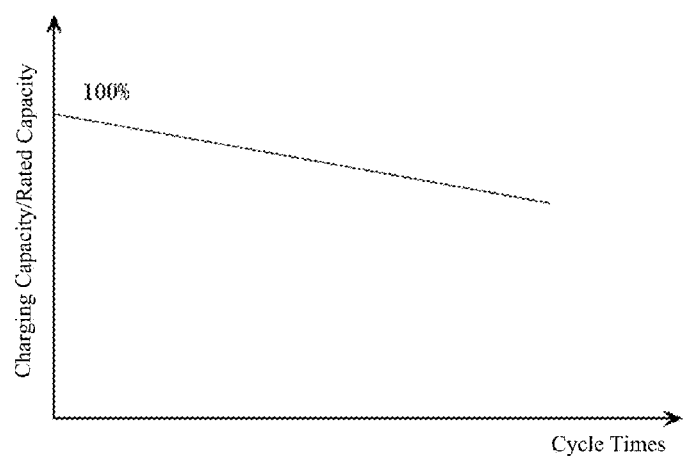
FIG. 13 is the curve for the relation between energy storage device charging capacity/rated capacity and cycle times.

As shown in FIG. 13, according to the relational curve between the charging capacity/rated capacity and cycle times of the energy storage device (that curve is provided by the supplier), inquire the charging capacity/rated capacity ratio after multiple cycles. As the discharging capacity is proportionate to the charging capacity, the relational curve between discharging capacity/rated capacity and cycle times can be used for replacement.

The corrected first voltage setting of energy storage device Umax=the charging capacity/rated capacity of the corrected first voltage setting of energy storage device Umax*obtained in Step B6.

What the system uses is the charging capacity/rated capacity after the energy storage device makes 1000 times of rated cycles.

Through that step, the influence of reduction in battery capacity on the system is pre-corrected, as a result, it is ensured that it is not necessary to correct in long system service the control parameters (the first voltage setting of energy storage device Umax). But the existing system with a SOC calculation mode has to estimate regularly the actual energy storage device capacity, reset the BC (energy storage device capacity) value in the system to improve the accuracy of SOC calculation.

C. The steps to determine the first current setting of DCDC Isetmin are shown below:

Step C1: Determine the lowest consumption current of the auxiliary system Is, specifically, use the obtained system controlled by the first voltage setting of energy storage device Umax to make the system be in an idle condition, after the system becomes stable, the consumption of the auxiliary system reduces to the minimum value, measure the current of the auxiliary system at this time, which is the lowest consumption current; where the lowest consumption current of the auxiliary system means the current consumed by the auxiliary system to maintain the minimum output of the auxiliary system and at which the fuel cell can be maintained to work.

Step C2: take the product of the lowest consumption current of the auxiliary system and coefficient K as the first current setting of DCDC Isetmin, where coefficient K is less than 1.

Preferably, coefficient K is 0.6, the reason is that the following factors have to be considered in actual setup:

a. The coefficient is to be several times higher than the measurement accuracy of the DCDC current measurement device.

b. The problem of drifting of the current sensor in long-term operation is to be considered, that the measurement value of the current sensor is higher than the actual current will not influence system operation; that the measurement value of the current sensor is lower than the actual current will influence system operation.

By considering the above factors comprehensively, in the preferable cases, coefficient K=0.6. That method need not rely too much on the accuracy, zero point, reaction speed, etc. of the sensor.

D. The steps to determine the maximum current setting that DCDC allows to output Imax are shown below:

Step D1: Determine according to the following formula (3) the maximum current setting that DCDC allows to output Imax:

$$I\max = \frac{I_{rated} \cdot E_{dcdc}}{U\max}$$

E. The steps to determine the second voltage setting of energy storage device Umin are shown below:

Step E1: Determine according to the following formula (4) the minimum charge capacity Cmin:

$$C\min = C - (I_s - I_{set\,min}) \cdot T$$

Where C is charging capacity, Is is the minimum consumption current of the auxiliary system, T is time, the said charging capacity is on the charging capacity and charging voltage curve of constant current charging with the maximum current setting that DCDC allows to output Imax as the current, find that the charging capacity that the first voltage setting of energy storage device Umax corresponds to for the charging voltage, the said time is set according to the response speed required by the system;

Step E2: According to the minimum charge capacity Cmin, find the charging voltage that the minimum charge capacity Cmin corresponds to on the charging capacity and charging voltage curve of constant current charging with the maximum current setting that DCDC allows to output Imax as the current, select that charging voltage as the second voltage setting of energy storage device Umin.

Further, determine through the following method the permissible DCDC current deviation value Ipermissible:

DCDC current deviation value=the DCDC converting unit output current controlled by system controller−the actual output current of DCDC converting unit.

Factors to be considered in actual setup:

a. The coefficient is to be several times higher than the measurement accuracy of DCDC current measurement device.

b. The problem of drifting of the current sensor in long-term operation is to be considered, that the measurement value of the current sensor is higher than the actual current will not influence system operation; that the measurement value of the current sensor is lower than the actual current will influence system operation.

Therefore, that value is preferably set as 5 A in this embodiment example.

Next, the specific applications of the said fuel cell mixed power supply energy management method is described through 4 different types of working conditions:

When the fuel cell power is used in vehicle work through the system that DCDC converting unit output is mixed with the energy storage device (the system as shown in FIG. 1):

Working condition 1: When the connected load (vehicle) operates at certain conditions (such as high power, startup), the required system current is higher than the DCDC converting unit current output, the insufficient current part is obtained from the energy storage device, at this time, the energy storage device voltage will inevitably decrease gradually. To avoid that the energy storage device voltage is lower than the minimum working voltage of the energy storage device resulting in the system being unable to operate, when the energy storage device voltage is lower than a certain value (the second voltage setting of energy storage device Umin), the system controller gradually increases the DCDC converting unit output current to make the energy storage device output current reduce gradually and the energy storage device voltage increase gradually. When operating at a high power continuously, the DCDC converting unit output current will increase until reaching the maximum current setting that DCDC allows to output.

Thus, through changing the output current of the DCDC converter, the effective and rational distribution of the energy required by the system is accomplished between the fuel cell and energy storage device.

Working condition 2: When the operating condition is changed so that the connected load (vehicle) operates at certain conditions (such as low power operation, idle speed), the required system current is less than the current output of DCDC converting unit, the DCDC converting unit charges the energy storage device, at this time, energy storage device voltage will inevitably increase gradually. To avoid that the energy storage device voltage exceeds the charging protection voltage of the energy storage device resulting in system stopping operation, when the energy storage device voltage reaches the set value (the first voltage setting of energy storage device Umax), the system controller gradually reduced the DCDC converting unit output current to make the energy storage device output voltage reduce gradually; when the energy storage device voltage is lower than the set value (the first voltage setting of energy storage device Umax), the DCDC converting unit output current will no longer change. At this time, that DCDC converting unit output current may still be higher than the system current that the system requires to maintain operation at a low power or idel speed, then the system repeats the above step; until the DCDC converting unit output current is less than the system current, the insufficient current part is obtained from the energy storage device, at this time, enter again into the case of above working condition 1.

Thus, through changing the output current of the DCDC converter, the replenishment of the electric quantity lost by the energy storage device is accomplished.

Working condition 3: When the connected load (vehicle) changes suddenly in some condition (from operation at a high power to operation at a low operation), the required system current reduces, the DCDC converting unit output current also reduces with it, at this time, the DCDC converting unit output current controlled by the system controller is higher than the actual output current of the DCDC converting unit. When the DCDC current deviation value is greater than or equal to the permissible DCDC current deviation value, the system controller controls to reduce at a fastest speed the DCDC converting unit output current until that output current is the first current setting of DCDC Isetmin, what that first current setting of DCDC Isetmin is less than the minimum power consumption of the system auxiliary components, current is obtained from system; at this time, the system control jumps to the case of above working condition 1. When the DCDC current deviation value is less than the permissible DCDC current deviation value, at this time, the system control enters into the case of above working condition 2.

The purpose to set up working condition 3: When a vehicle operates practically, it may change back to operation at a high power after turning from operation at a high power to operation at low power, the system may suddenly output a high current again; at this time, if working condition 3 is not set up to reduce the DCDC converting unit output current controlled by the system controller, then when the system outputs a high current suddenly, as the DCDC converting unit output current controlled by the system controller is higher than the actual output current of the DCDC converting unit, power may be obtained first from the DCDC converting unit, resulting in an impact on the fuel cell.

In this way, by setting the output current of the DCDC converter, the distribution strategy at the time when the system adds load suddenly is ensured: the energy storage device outputs first, the fuel cell follows.

Working condition 4: When a vehicle brakes, the vehicle with an energy feedback function will turn the energy resulting from braking into electric energy and feed it back to the power supply system; for a fuel cell system, such a condition is external current input into it, that current is input into the energy storage device, at the same time, the current outputted by the DCDC converting unit is also input into the energy storage device, this may make the energy storage device voltage increase sharply to the protection voltage and trigger shutdown, as a result, the energy resulting from braking can not be recovered to lead to the vehicle being out of control; therefore, when braking, it is necessary to control and reduce the current outputted by the DCDC converting unit first. To avoid that the energy storage device voltage exceeds the protection voltage of the energy storage device, when the energy storage device voltage reaches the set value (the first voltage setting of energy storage device Umax), the system controller controls to reduce gradually the DCDC converting unit output current, until that output current is the current setting of DCDC1. When that value is less than the minimum power consumption of the system auxiliary components, current is obtained from the system. After braking is over, the system controls to jump to the case of working condition 1.

Figure 14:
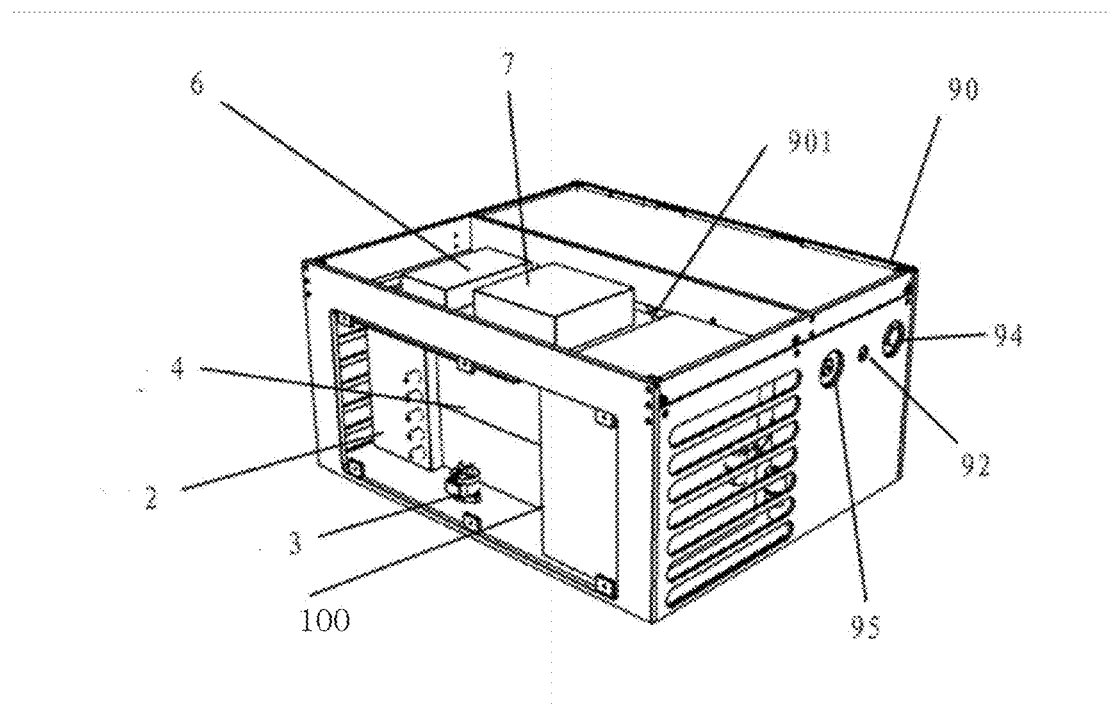
FIG. 14 is the schematic diagram of the general structure of forklift fuel cell supply system.
Figure 15:
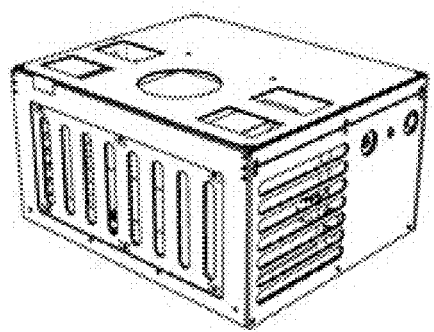
FIG. 15 is embodiment A-1 of forklift fuel cell supply system.
Figure 16:
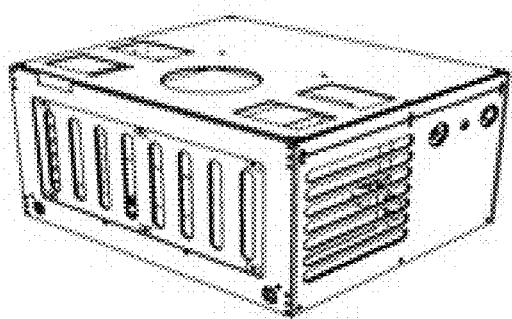
FIG. 16 is embodiment A-2 for forklift fuel cell supply system.

Next, a kind of forklift fuel cell supply system based on this invention is shown through FIGS. 14 to 16.

The said forklift fuel cell supply system consists of enclosure 90 and the fuel cell system 100, DCDC converting unit 2, contactor 3, energy storage device 4, controller 7 provided in the said enclosure 90, which also consists of the power supply output end 5 provided outside the said enclosure 90 and the operation control unit 6 provided in the said enclosure 90, in which the said contactor 3 is a normal open type high-current contactor, the said DCDC converting unit 2 includes the DCDC converter 21 and high-power diode 22 connecting with it, The said fuel cell system 100 connects the said DCDC converting unit 2, contactor 3, power supply output end 5, the said controller 7 connects the said fuel cell system 100, operation control unit 6, contactor 3, the said energy storage device 4 connects the said controller 7, operation control unit 6 and contactor 3.

Preferably, the said fuel cell system 100, energy storage device 4, DCDC converting unit 2 are installed in proper order on the base plate of the said enclosure 90 along the said enclosure 90 in a direction from front to back.

Preferably, the installation positions of both the said operation control unit 6 and controller 7 are higher than that of the said DCDC converting unit 2 and energy storage device 4.

Preferably, the said operation control unit 6 and controller 7 are installed in proper order along the said enclosure 90 in a direction from front to back.

Preferably, the said contactor 3 is installed in the area located between the side board of the said enclosure 90 and the said energy storage device 4 on the said base plate.

Preferably, the electric isolation board 901, the hydrogen storage system, the filling valve 95 provided in the said enclosure 90 are also included, the said electric isolation board 901 divides the space of the said enclosure 90 into an electronic system space and a gas supply space, the said fuel cell system 100, DCDC converting unit 2, contactor 3, energy storage device 4, controller 7, operation control unit 6 are located in the said electronic system space, the said hydrogen storage system, filling valve 95 are located in the said gas supply space, the said gas supply space is located on one side of the said electronic system space.

Preferably, the output end of the fuel cell 1 that the said fuel cell system 100 contains connects the input end of the said DCDC converting unit 2, the DCDC converting unit 2 connects through the said contactor 3 the said energy storage device 4, the output end of the said DCDC converting unit 2 also connects the said power supply output end 5 and the high-power auxiliary component 80 that the said fuel cell system 100 contains, the port of the said energy storage device 4 connects through the said contactor 3 the said power supply output end 5 and the high-power auxiliary component 80 that the said fuel cell system 100 contains, the said operation control unit 6 connects respectively the said energy storage device 4, DCDC converting unit 2, controller 7, the said controller 7 connects respectively the fuel cell that the said fuel cell system 100 contains, auxiliary system 8, DCDC converting unit 2, the control end of contactor 3, the energy storage device 4, in which the said auxiliary system 8 includes the said high-power auxiliary component 80, the said operation control unit 6 is used to receive operation signals and supplies power for the said controller 7 and DCDC converting unit 2, the said controller 7 is used to receive the operation instructions generated by the said operation control unit 6 according to the said operation signals and control according to the said operation instructions the said contactor 3, DCDC converting unit 2, auxiliary system 8, the said controller 7 is also used to measure the state parameters of the fuel cell 1 that the said fuel cell system 100 contains, measure the state parameters of the said energy storage device 4, measure the state parameters of the said auxiliary system and receive the state data of the said DCDC converting unit 2.

Preferably, the output end of the said fuel cell 1 connects the input end of the said DCDC converter 21, the positive pole of the output end of the said DCDC converter 21 connects the positive pole of the said high-power diode 22, the negative pole of the said high-power diode 22 connects through the said contactor 3 the said energy storage device 4, the said DCDC converter 21 connects the said controller 7 and is controlled by the said controller 7, the said DCDC converter 21 connects the said operation control unit 6 and receives power supplied by the said operation control unit 6.

Preferably, the said operation control unit 6 changes the electric connection state with the said DCDC converting unit and controller 7 according to the startup operation signal received.

Preferably, the state data of the said DCDC converting unit 2 include DCDC input current, DCDC input voltage.

Preferably, any one or more types of following devices are also included:
Hydrogen safety system, the said hydrogen safety system include the sensors placed respectively in the electronic control system space and gas supply space, the said sensors connect the said controller 7,
Monitoring display 91, with the said monitoring display 91 connecting the said controller 7,
ON and OFF button 92, with the said ON and OFF button 92 connecting respectively the said operation control unit 6 and controller 7,
Remote control 93, the said remote control 93 connecting in a radio mode the said operation control unit 6,
Emergency stop button 94, with the said emergency stop button 94 connecting the said operation control unit 6.

The said forklift fuel cell supply system relates to a fuel cell system.

When designing a forklift fuel cell system, in order to replace with the existing lead-acid battery directly to avoid forklift modification, all parts and components have to be centralized in a rectangular empty chamber. The forklift fuel cell system needs to include controller, energy storage device, DCDC converter, contactor, fuel cell system, hydrogen filling valve, hydrogen bottle, hydrogen system, etc. In order for the system to reach a weight equal to that of lead-acid battery, weights have to be placed. The parts and components required by the whole system are integrated in a narrow space, resulting in space being not available between parts and components. This may bring a very high trouble to installation, disassembly. Even when disassembling some parts and components, other parts and components have to be removed first.

The existing technology has a lot of disadvantages. Some design reduces system function; some design adopts an energy storage device with a small size and a small capacity, resulting in reduction in system performance; some design even has the hydrogen bottle be placed outside the system; some design provides almost no space for moving between parts and components in the system, as a result, when disassembling a part and component, other parts and components have to be removed; some design has no space in the system for the emergency stop button and relies on the emergency stop button designed for the hydrogen filling system, this may result in being unable to close the system quickly under an exceptional system emergency condition.

The technical scheme publicized by the utility model patent of China called "forklift gas bottle fixing device" with application number "200820233706.2" has the gas bottle be placed at the back end of a forklift, when using, it is necessary to change the hydrogen bottle, this also needs a lot of time. At the same time, placing a gas bottle at back of a forklift is very unsafe. Due to system being not compact, that scheme is unable to place the hydrogen bottle inside the system.

The Canadian patent called "FUEL CELL INDUSTRIAL VEHICLE" with publication number "CA2659135A1" provides a fuel cell forklift system scheme and redesigns the whole forklift. No direct replacement of the existing forklift cell can be made.

The utility model patent of China called "a new type of forklift" with application number "200920174236.1" provides a technical scheme which also considers redesign of existing vehicle.

The utility model patent of China called "a type of fuel cell forklift" with application number "200820179687.X" provides a technical scheme which also considers forklift redesign.

Aimed at the defects in existing technology, the said improved forklift fuel cell supply system solves the compact problem with the forklift fuel cell system. The forklift fuel cell has the whole system be placed in a rectangular empty chamber. Due to dimensional limitation, there is almost no space for moving between the parts and components. The line installation is troublesome. Disassembly of parts and components are troublesome with other parts and components having to be removed first. A space for weights is reserved.

Comparing with the existing technology, the said forklift fuel cell supply system has the following beneficial effects:

1) The energy storage device placed by the existing technology in the system is small in capacity, making the energy storage device be in a charging and discharging condition with a high multiplying factor and reducing the service life of the energy storage device. The said forklift fuel cell supply system can contain an energy storage device with a higher capacity, making the energy storage device be in a charging and discharging condition with a low multiplying factor and extending the service life of the energy storage device and the time for which the system can be left unused. For example, in the circumstance that what is placed in the energy storage device is a lithium ion battery, the lithium ion battery placed as designed by the existing technology has a capacity 32 AH, a peak output 48 KW. The lithium ion battery that can be placed in the forklift fuel cell supply system has a capacity 50 AH, a peak output 72 KW. When absorbing the forklift braking at 600 A, the charging multiplying factor is 12 C. That value in the existing technology is 18 C. A higher energy storage device capacity reduces the charging and discharging multiplying factor at the same current output and favors extension of battery service life.

2) The said forklift fuel cell supply system is compact in structure and facilitates such work as system installation, overhaul and maintenance, etc.

3) In the enclosure, the operation control unit, controller are placed on the top. In the circumstance when they are not used by the system and moved outside forklift, inspection and maintenance, failure recovery can be made. The controller control software upgrading is also facilitated.

4) Spaces are reserved between parts and components, parts and components and enclosure, which facilitates line connection, part and component removal.

5) The compact structural design of the said forklift fuel cell supply system allows placing of the emergency stop button. In case of any emergency, the whole system can be disconnected quickly.

6) Such components as ON and OFF button, emergency stop button, filling valve, etc. required by system operation are placed at appropriate heights to facilitate filling, operation.

More specifically, the said forklift fuel cell supply system consists of enclosure 90 and the fuel cell system 100, DCDC converting unit 2, contactor 3, energy storage device 4, controller 7, operation control unit 6, electric isolation board 901, hydrogen storage system, filling valve 95 provided in the said enclosure 90, which also consists of the power supply output end 5 provided outside the said enclosure 90. In which, the said contactor 3 is a normal open type high-current contactor, the said DCDC converting unit 2 includes the DCDC converter 21 and high-power diode 22 connecting with it. The said fuel cell system 100 connects the said DCDC converting unit 2, contactor 3, power supply output end 5, the said controller 7 connects the said fuel cell system 100, operation control unit 6, contactor 3, the said energy storage device 4 connects the said controller 7, operation control unit 6, contactor 3.

The said fuel cell system 100, energy storage device 4, DCDC converting unit 2 are installed in proper order on the base plate of the said enclosure 90 along the said enclosure 90 in a direction from front to back. The installing positions of both the said operation control unit 6 and controller 7 are higher than that of the said DCDC converting unit 2 and energy storage device 4. The said operation control unit 6 and controller 7 are installed in proper order along the said enclosure 90 in a direction from front to back. The said contactor 3 is installed in the area located between the side board of the said enclosure 90 and the said energy storage device 4 on the said base plate.

The said electric isolation board 901 divides the space of the said enclosure 90 into electronic system space and gas supply space, the said fuel cell system 100, DCDC converting unit 2, contactor 3, energy storage device 4, controller 7, operation control unit 6 are located inside the said electronic system space, the said hydrogen storage system, filling valve 95 are located in the said gas supply space, the said gas supply space is located on one side of the said electronic system space.

In a preferable case, the said forklift fuel cell supply system also consists of hydrogen safety system, monitoring display 91, ON and OFF button 92, remote control 93, emergency stop button 94, in which the said hydrogen safety system consists of the sensors placed respectively in the electronic control system space and gas supply space, the said sensors connect the said controller 7, the said monitoring display 91 connects the said controller 7, the said ON and OFF button 92 connects respectively the said operation control unit 6 and controller 7, the said remote control 93 connects in a radio mode the said operation control unit 6, the said emergency stop button 94 connects the said operation control unit 6.

The said fuel cell system 100 consists of fuel cell 1 and auxiliary system 8. The said auxiliary system 8 consists of air supply system, cooling system, hydrogen system, the said high-power auxiliary component 80 refers to a high-power component in the auxiliary system (for example, fan, pump, heat dissipation fan). The technical people in this field can refer to the existing technology to accomplish the said auxiliary system 8 and its high-power auxiliary component 80. No unnecessary detail is to be given here.

FIG. 15 and FIG. 16 show the fuel cell supply systems in the two embodiments according to the said forklift fuel cell supply system. Specifically, FIG. 15 shows embodiment A-1: the 2-ton electric forklift from a forklift plant uses Model 9PZS630 48V lead-acid battery. That lead-acid battery is 1,070 mm long, 827 mm wide, 520 mm high, weighs 1,070 kg with a voltage 48V. The working voltage range of the forklift is 40-60V. The system is designed to have a length 980 mm, a width 827 mm, a height 520 mm and a weight 1,070 Kg, the rated voltage of the system is 40-60V. FIG. 16 shows embodiment A-2: the four-wheel counterbalanced type forklift from a forklift plant using lead-acid battery is 982 mm long, 836 mm wide, 565 mm high and weighs 1,400 kg. The working voltage range of the forklift is 40-60V. The system is designed to have a length 980 mm, a width 827 mm, a height 565 mm and a weight 1400 Kg. The rated voltage of the system is 40-60V. Being similar to embodiment A, it has a counterweight layer added on the bottom to reach the required forklift weight.

The reason that a compact structure as shown in FIG. 14 can be designed for the said forklift fuel cell supply system is mainly due to adopting the compact type fuel cell supply system as shown in FIG. 1.

Figure 17:
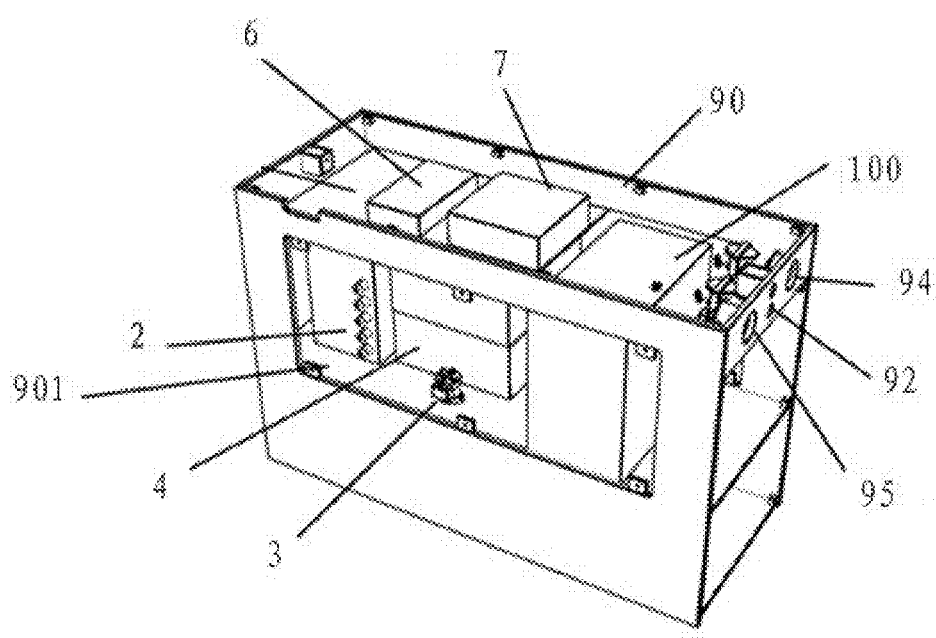
FIG. 17 is the schematic diagram of the general structure of the improved forklift fuel cell supply system.
Figure 18:
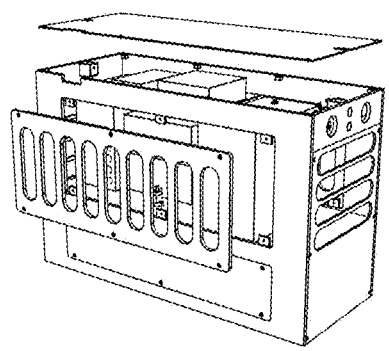
FIG. 18 is embodiment B-1 of the improved forklift fuel cell supply system.
Figure 19:
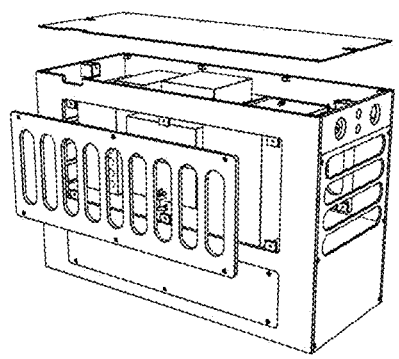
FIG. 19 is embodiment B-2 of the improved forklift fuel cell supply system.

Next, a type of improved forklift fuel cell supply system based on this invention is shown through FIGS. 17 to 19.

The said improved forklift fuel cell supply system consists of enclosure 90 and the fuel cell system 100, DCDC converting unit 2, contactor 3, energy storage device 4, controller 7 provided in the said enclosure 90, which also consists of the power supply output end 5 provided outside the said enclosure 90 and the operation control unit 6, electric isolation board 901, hydrogen storage system, filling valve 95 provided in the said enclosure 90, in which the said contactor 3 is a normal open type high-current contactor, the said DCDC converting unit 2 includes the DCDC converter 21 and high-power diode 22 connecting with it, The said fuel cell system 100 connects the said DCDC converting unit 2, contactor 3, power supply output end 5, the said controller 7 connects the said fuel cell system 100, operation control unit 6, contactor 3, the said energy storage device 4 connects the said controller 7, operation control unit 6 and contactor 3, The said electric isolation board 901 divides the space of the said enclosure 90 into electronic system space and gas supply space, the said fuel cell system 100, DCDC converting unit 2, contactor 3, energy storage device 4, controller 7, operation control unit 6, filling valve 95 are located in the said electronic system space, the said hydrogen storage system is located in the said gas supply space, the said gas supply space is located at the lower part of the said electronic system space.

Preferably, the said fuel cell system 100, energy storage device 4, DCDC converting unit 2 are installed in proper order on the electric isolation board 901 of the said enclosure 90 along the said enclosure 90 in a direction from front to back.

Preferably, the installing positions of both the said operation control unit 6 and controller 7 are higher than that of the said DCDC converting unit 2 and energy storage device 4.

Preferably, the said operation control unit 6 and controller 7 are installed in proper order along the said enclosure 90 in a direction from front to back.

Preferably, the said contactor 3 is installed in the area located between the side board of the said enclosure 90 and the said energy storage device 4 on the said base plate.

Preferably, the output end of fuel cell 1 that the said fuel cell system 100 contains connects the input end of the said DCDC converting unit 2, the DCDC converting unit 2 connects through the said contactor 3 the said energy storage device 4, the output end of the said DCDC converting unit 2 also connects the said power supply output end 5 and the high-power auxiliary component 80 that the said fuel cell system 100 contains, the port of the said energy storage device 4 connects through the said contactor 3 the said power supply output end 5 and the high-power auxiliary component 80 that the said fuel cell system 100 contained, the said operation control unit 6 connects respectively the said energy storage device 4, DCDC converting unit 2, controller 7, the said controller 7 connects respectively the fuel cell that the said fuel cell system 100 contains, the auxiliary system 8, the DCDC converting unit 2, the control end of the contactor 3, the energy storage device 4, in which the said auxiliary system 8 includes the said high-power auxiliary component 80, The said operation control unit 6 is used to receive operation signals and supplies power for the said controller 7 and DCDC converting unit 2, the said controller 7 is used to receive the operation instructions generated by the said operation control unit 6 according to the said operation signals and controls according to the said operation instructions the said contactor 3, DCDC converting unit 2, auxiliary system 8, the said controller 7 is also used to measure the state parameters of the fuel cell 1 that the said fuel cell system 100 contains, measure the state parameters of the said energy storage device 4, measure the state parameters of the said auxiliary system and receive the state data of the said DCDC converting unit 2.

Preferably, the output end of the said fuel cell 1 connects the input end of the said DCDC converter 21, the positive pole of the output end of the said DCDC converter 21 connects the positive pole of the said high-power diode 22, the negative pole of the said high-power diode 22 connects through the said contactor 3 the said energy storage device 4, the said DCDC converter 21 connects the said controller 7 and is controlled by the said controller 7, the said DCDC converter 21 connects the said operation control unit 6 and receives the power supplied by the said operation control unit 6.

Preferably, the said operation control unit 6 changes the electric connection state with the said DCDC converting unit and controller 7 according to the startup operation signal received.

Preferably, the state data of the said DCDC converting unit 2 include DCDC input current, DCDC input voltage.

Preferably, any one or more following devices are also included:

The hydrogen safety system, the said hydrogen safety system include the sensors placed respectively in the electronic control system space and gas supply space, the said sensors connect the said controller 7, The monitoring display 91, the said monitoring display 91 connect the said controller 7, ON and OFF button 92, the said ON and OFF button 92 connects respectively the said operation control unit 6 and controller 7, Remote control 93, the said remote control 93 connects in a radio mode the said operation control unit 6, Emergency stop button 94, the said emergency stop button 94 connects the said operation control unit 6.

The said improved forklift fuel cell supply system relates to a fuel cell system.

When designing a forklift fuel cell system, in order to replace with the existing lead-acid battery directly to avoid forklift modification, all parts and components have to be centralized in a rectangular empty chamber. The forklift fuel cell system needs to include controller, energy storage device, DCDC converter, contactor, fuel cell system, hydrogen filling valve, hydrogen bottle, hydrogen system, etc. In order for the system to reach a weight equal to that of lead-acid battery, weights have to be placed. The parts and components required by the whole system are integrated in a narrow space, resulting in space being not available between parts and components. This may bring a very high trouble to installation, disassembly. Even when disassembling some parts and components, other parts and components have to be removed first.

The existing technology has a lot of disadvantages. Some design reduces system function; some design adopts an energy storage device with a small size and a small capacity, resulting in reduction in system performance; some design even has the hydrogen bottle be placed outside the system; some design provides almost no space for moving between parts and components in the system, as a result, when disassembling a part and component, other parts and components have to be removed; some design has no space in the system for the emergency stop button and relies on the emergency stop button designed for the hydrogen filling system, this may result in being unable to close the system quickly under an exceptional system emergency condition.

The technical scheme publicized by the utility model patent of China called "forklift gas bottle fixing device" with application number "200820233706.2" has the gas bottle be placed at the back end of a forklift, when using, it is necessary to change the hydrogen bottle, this also needs a lot of time. At the same time, placing a gas bottle at back of a forklift is very unsafe. Due to system being not compact, that scheme is unable to place the hydrogen bottle inside the system.

The Canadian patent called "FUEL CELL INDUSTRIAL VEHICLE" with publication number "CA2659135A1" provides a fuel cell forklift system scheme and redesigns the whole forklift. No direct replacement of the existing forklift cell can be made.

The utility model patent of China called "a new type of forklift" with application number "200920174236.1" provides a technical scheme which also considers redesign of existing vehicle.

The utility model patent of China called "a type of fuel cell forklift" with application number "200820179687.X" provides a technical scheme which also considers forklift redesign.

Aimed at the defects in existing technology, the said improved forklift fuel cell supply system solves the compact problem with the forklift fuel cell system. The forklift fuel cell has the whole system be placed in a rectangular empty chamber. Due to dimensional limitation, there is almost no space for moving between the parts and components. The line installation is troublesome. Disassembly of parts and components are troublesome with other parts and components having to be removed first. A space for weights is reserved.

Comparing with the existing technology, the said improved forklift fuel cell supply system has the following beneficial effects:

1) The energy storage device placed by the existing technology in the system is small in capacity, making the energy storage device be in a charging and discharging condition with a high multiplying factor and reducing the service life of the energy storage device. The said improved forklift fuel cell supply system can contain an energy storage device with a higher capacity, making the energy storage device be in a charging and discharging condition with a low multiplying factor and extending the service life of the energy storage device and the time for which the system can be left unused. For example, in the circumstance that what is placed in the energy storage device is a lithium ion battery, the lithium ion battery placed as designed by the existing technology has a capacity 32 AH, a peak output 48 KW. The lithium ion battery that can be placed in the said improved forklift fuel cell supply system has a capacity 50 AH, a peak output 72 KW. When absorbing the forklift braking at 600 A, the charging multiplying factor is 12 C. That value in the existing technology is 18 C. A higher energy storage device capacity reduces the charging and discharging multiplying factor at the same current output and favors extension of battery service life.

2) The said improved forklift fuel cell supply system is compact in structure and facilitates such work as system installation, overhaul and maintenance, etc.

3) In the enclosure, the operation control unit, controller are placed on the top. In the circumstance when they are not used by the system and moved outside forklift, inspection and maintenance, failure recovery can be made. The controller control software upgrading is also facilitated.

4) Spaces are reserved between parts and components, parts and components and enclosure, which facilitates line connection, part and component removal.

5) The compact structural design of the said improved forklift fuel cell supply system allows placing of the emergency stop button. In case of any emergency, the whole system can be disconnected quickly.

6) Such components as ON and OFF button, emergency stop button, filling valve, etc. required by system operation are placed at appropriate heights to facilitate filling, operation.

More specifically, the said improved forklift fuel cell supply system consists of enclosure 90 and the fuel cell system 100, DCDC converting unit 2, contactor 3, energy storage device 4, controller 7 provided in the said enclosure 90, which also consists of the power supply output end 5 provided outside the said enclosure 90 and the operation control unit 6, electric isolation board 901, hydrogen storage system, filling valve 95 provided the said enclosure 90. In which, the said contactor 3 is a normal open type high-current contactor, the said DCDC converting unit 2 includes the DCDC converter 21 and high-power diode 22 connecting with it, The said fuel cell system 100 connects the said DCDC converting unit 2, contactor 3, power supply output end 5, the said controller 7 connects the said fuel cell system 100, operation control unit 6, contactor 3, the said energy storage device 4 connects the said controller 7, operation control unit 6 and contactor 3, The said electric isolation board 901 divides the space of the said enclosure 90 into an electronic system space and a gas supply space, the said fuel cell system 100, DCDC converting unit 2, contactor 3, energy storage device 4, controller 7, operation control unit 6, filling valve 95 are located in the said electronic system space, the said hydrogen storage system is located in the said gas supply space, the said gas supply space is located at the lower part of the said electronic system space.

The said fuel cell system 100, energy storage device 4, DCDC converting unit 2 are provided in proper order on the electric isolation board 901 of the said enclosure 90 along the said enclosure 90 in a direction from front to back. The installing positions of both the said operation control unit 6 and controller 7 are higher than that of the said DCDC converting unit 2 and energy storage device 4. The said operation control unit 6 and controller 7 are installed in proper order along the said enclosure 90 in a direction from front to back. The said contactor 3 is installed in an area located between the side board of the said enclosure 90 and the said energy storage device 4 on the said base plate.

In a preferable case, the said forklift fuel cell supply system also consists of hydrogen safety system, monitoring display 91, ON and OFF button 92, remote control 93, emergency stop button 94, in which the said hydrogen safety system includes the sensors placed respectively in the electronic control system space and gas supply space, the said sensors connect the said controller 7, the said monitoring display 91 connects the said controller 7, the said ON and OFF button 92 connects respectively the said operation control unit 6 and controller 7, the said remote control 93 connects in a radio mode the said operation control unit 6 and the said emergency stop button 94 connects the said operation control unit 6.

The said fuel cell system 100 consists of fuel cell 1 and auxiliary system 8. The said auxiliary system 8 consists of air supply system, cooling system, hydrogen system, the said high-power auxiliary component 80 refers to a high-power component in the auxiliary system (for example, fan, pump, heat dissipation fan). The technical people in this field can refer to the existing technology to accomplish the said auxiliary system 8 and its high-power auxiliary component 80. No unnecessary detail is to be given here.

FIG. 18 and FIG. 19 show the fuel cell supply systems in the two embodiments of the said improved forklift fuel cell supply system. Specifically, FIG. 18 shows embodiment B-1: the 2-ton electric forklift from a forklift plant uses 48V lead-acid battery. That lead-acid battery is 1,210 mm long, 496 mm wide, 785 mm high, weighs 1,300 kg with a voltage 48V. The working voltage range of the forklift is 40-60V. The system is designed to have a length 1,210 mm, a width 500 mm, a height 780 mm and a weight 1,300 Kg, the rated voltage of the system is 40-60V. FIG. 19 shows embodiment B-2: the three-wheel standing steer and counterbalanced type forklift from a forklift plant using 36V lead-acid battery is 980 mm long, 520 mm wide, 787 mm high and weighs 1,180 kg. The working voltage range of the forklift is 30-45V. The system is designed to have a length 980 mm, a width 496 mm, a height 780 mm and a weight 1,180 Kg. The rated voltage of the system is 30-45V.

The reason that a compact structure as shown in FIG. 17 can be designed for the said forklift fuel cell supply system is mainly due to adopting the compact type fuel cell supply system as shown in FIG. 1.

Figure 20:
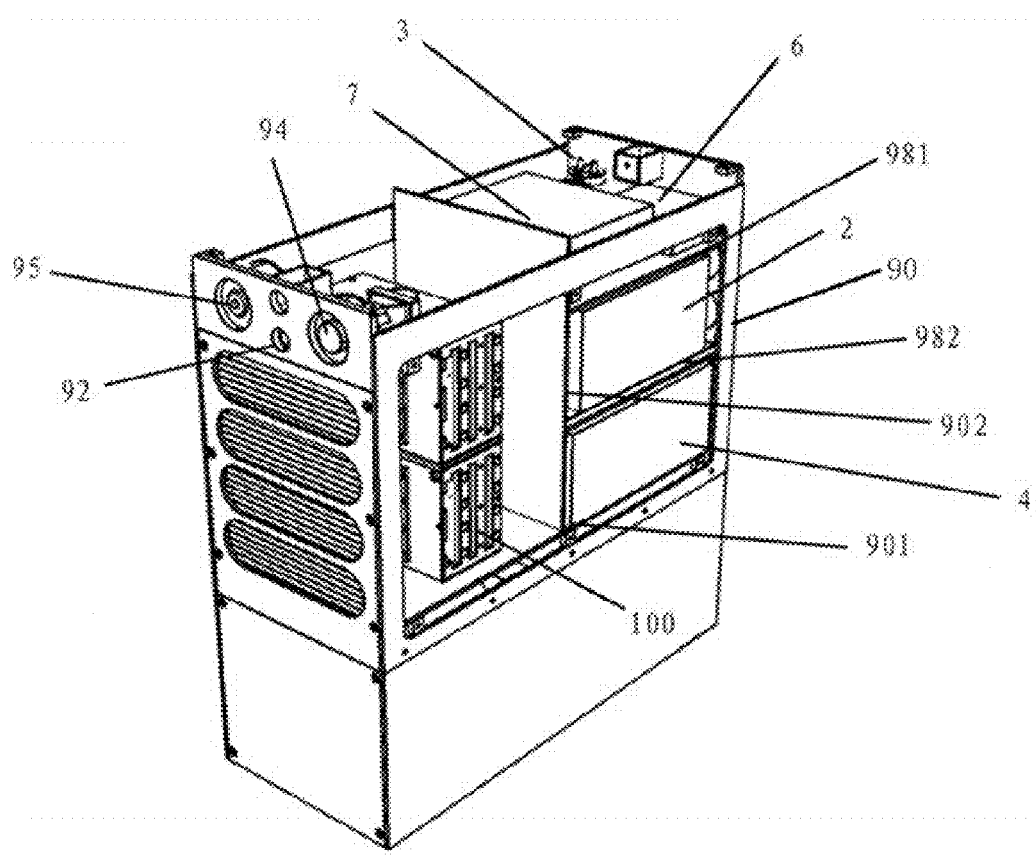
FIG. 20 is the schematic diagram of the general structure of the miniaturized forklift fuel cell supply system.
Figure 21:
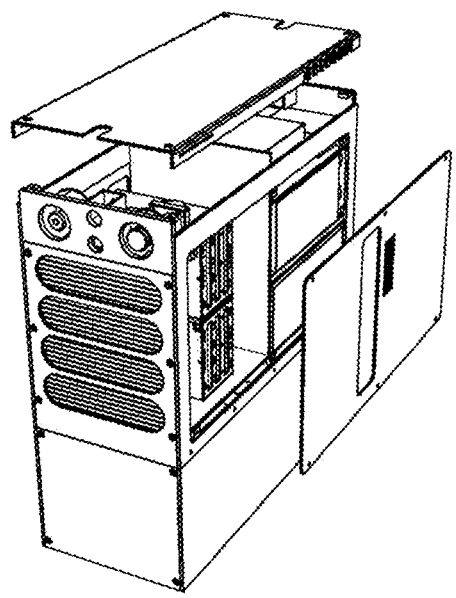
FIG. 21 is embodiment C-1 of the miniaturized forklift fuel cell supply system.
Figure 22:
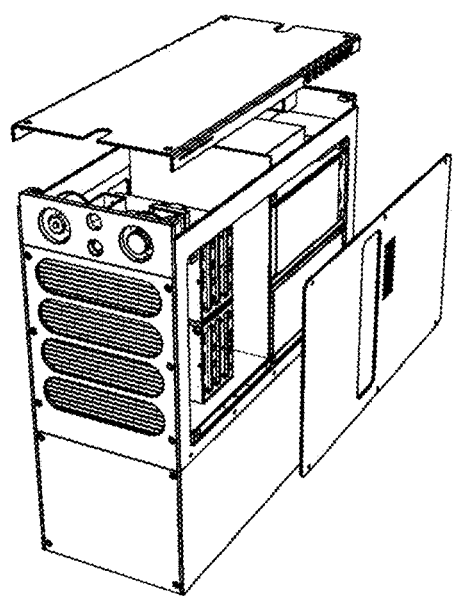
FIG. 22 is embodiment C-2 of the miniaturized forklift fuel cell supply system.

Next, a type of miniaturized forklift fuel cell supply system based on this invention is shown through FIGS. 20 to 22.

The said miniaturized forklift fuel cell supply system consists of enclosure 90 and the fuel cell system 100 provided in the said enclosure 90, DCDC converting unit 2, contactor 3, energy storage device 4, controller 7, which also consists of the power supply output end 5 provided outside the said enclosure 90 and the operation control unit 6 provided in the said enclosure 90, in which, the said contactor 3 is a normal open type high-current contactor, the said DCDC converting unit 2 includes the DCDC converter 21 and high-power diode 22 connecting with it, The said fuel cell system 100 connects the said DCDC converting unit 2, contactor 3, power supply output end 5, the said controller 7 connects the said fuel cell system 100, operation control unit 6, contactor 3, the said energy storage device 4 connects the said controller 7, operation control unit 6 and contactor 3, The said fuel cell system 100, energy storage device 4 are provided in proper order on the electric isolation board 901 of the said enclosure 90 along the said enclosure 90 in a direction from front to back, the said DCDC converting unit 2 is located right above the said energy storage device 4, the said operation control unit 6 and controller 7 are located right above the said DCDC converting unit 2.

Preferably, the said controller 7 and operation control unit 6 are installed in proper order along the said enclosure 90 in a direction from front to back.

Preferably, the said contactor 3 is installed in the space between the side board of the said enclosure 90 and the said operation control unit 6.

Preferably, the hydrogen storage system, the filling valve 95 provided in the said enclosure 90 are also included, the said electric isolation board 901 divides the space of the said enclosure 90 into an electronic system space and a gas supply space, the said fuel cell system 100, DCDC converting unit 2, contactor 3, energy storage device 4, controller 7, operation control unit 6, filling valve 95 are located in the said electronic system space, the said hydrogen storage system is located in the said gas supply space, the said gas supply space is located at the lower part of the said electronic system space.

Preferably, the output end of the fuel cell 1 that the said fuel cell system 100 contains connects the input end of the said DCDC converting unit 2, the DCDC converting unit 2 connects through the said contactor 3 the said energy storage device 4, the output end of the said DCDC converting unit 2 also connects the said power supply output end 5 and the high-power auxiliary component 80 that the said fuel cell system 100 contains, the port of the said energy storage device 4 connects through the said contactor 3 the said power supply output end 5 and the high-power auxiliary component 80 that the said fuel cell system 100 contains, the said operation control unit 6 connects respectively the said energy storage device 4, DCDC converting unit 2, controller 7, the said controller 7 connects respectively the fuel cell that the said fuel cell system 100 contains, auxiliary system 8, DCDC converting unit 2, the control end of contactor 3, energy storage device 4, in which, the said auxiliary system 8 includes the said high-power auxiliary component 80, The said operation control unit 6 is used to receive operation signals and supplies power for the said controller 7 and DCDC converting unit 2, the said controller 7 is used to receive the operation instructions generated by the said operation control unit 6 according to the said operation signals and controls according to the said operation instructions the said contactor 3, DCDC converting unit 2, auxiliary system (8), the said controller 7 is also used to measure the state parameters of the fuel cell 1 that the said fuel cell system 100 contains, measure the state parameters of the said energy storage device 4, measures the state parameters of the said auxiliary system and receives the state data of the said DCDC converting unit 2.

Preferably, the output end of the said fuel cell 1 connects the input end of the said DCDC converter 21, the positive pole of the output end of the said DCDC converter 21 connects the positive pole of the said high-power diode 22, the negative pole of the said high-power diode 22 connects through the said contactor 3 the said energy storage device 4, the said DCDC converter 21 connects the said controller 7 and is controlled by the said controller 7, the said DCDC converter 21 connects the said operation control unit 6 and receives the power supplied by the said operation control unit 6.

Preferably, the said operation control unit 6 changes the electric connection state with the said DCDC converting unit and controller 7 according to the startup operation signal received.

Preferably, the state data of the said DCDC converting unit 2 include DCDC input current, DCDC input voltage.

Preferably, any one or more following devices are also included:

The hydrogen safety system, the said hydrogen safety system includes the sensors placed respectively in the electronic control system space and gas supply space, the said sensors connect the said controller 7, The monitoring display 91, the said monitoring display 91 connects the said controller 7, The ON and OFF button 92, the said ON and OFF button 92 connects respectively the said operation control unit 6 and controller 7, The remote control 93, the said remote control 93 connects in a radio mode the said operation control unit 6, The emergency stop button 94, the said emergency stop button 94 connects the said operation control unit 6.

The said miniaturized forklift fuel cell supply system relates to a fuel cell system.

At present, a lot of electric vehicles exists, for example, electric forklift, electric tourist coach, etc. All these electric vehicles use lead-acid battery as the source of electric energy. In relation to internal combustion engine, the lead-acid battery has no noise, exhaust gas and is much cleaner and more environmentally friendly. However, the lead-acid battery has a lot of problems in production, use.

In use, with the capacity of lead-acid battery reducing, the forklift power performance reduces, which is embodied by lower forklift speed, being unable to lift up a load. The working efficient is seriously influenced. The lead-acid battery needs 6~8 hours for charging after use and it takes 20 minutes for changing batteries. A logistic center with three shifts has to use three lead-acid batteries to supply power for one electric forklift. As the usable capacity reduces constantly, a lead-acid battery can only be used for 2~3 years. A forklift working for three shifts has to change 3 groups of batteries.

Lead-acid battery can generate acid mist in use, even in the food in a logistic center, lead can be detected. As lead-acid battery has a lot of pollution in production, a lot of countries and regions have gradually limited the production and manufacturing of lead-acid batteries. This has led to the price of lead-acid battery rising to a certain degree.

Each year, a lot of electric forklifts are sold, leading to a lot of lead-acid batteries needing replacement. Therefore, a kind of new power supply is needed urgently for replacement. The existing technology provides multiple schemes, but the existing technology has a lot of disadvantages. Some design reduces system function; some design adopts an energy storage device with a small size and a small capacity, resulting in reduction in system performance; some design even has the hydrogen bottle be placed outside the system; some design provides almost no space for moving between parts and components in the system, as a result, when disassembling a part and component, other parts and components have to be removed; some design has no space in the system for the emergency stop button and relies on the emergency stop button designed for the hydrogen filling system, this may result in being unable to close the system quickly under an exceptional system emergency condition.

The technical scheme publicized by the utility model patent of China called "forklift gas bottle fixing device" with application number "200820233706.2" has the gas bottle be placed at the back end of a forklift, when using, it is necessary to change the hydrogen bottle, this also needs a lot of time. At the same time, placing a gas bottle at back of a forklift is very unsafe. Due to system being not compact, that scheme is unable to place the hydrogen bottle inside the system.

The Canadian patent called "FUEL CELL INDUSTRIAL VEHICLE" with publication number "CA2659135A1" provides a fuel cell forklift system scheme and redesigns the whole forklift. No direct replacement of the existing forklift cell can be made.

The utility model patent of China called "a new type of forklift" with application number "200920174236.1" provides a technical scheme which also considers redesign of existing vehicle.

The utility model patent of China called "a type of fuel cell forklift" with application number "200820179687.X" provides a technical scheme which also considers forklift redesign.

Aimed at the defects in existing technology, the said miniaturized forklift fuel cell supply system solves the compact problem with the forklift fuel cell system. The forklift fuel cell has the whole system be placed in a rectangular empty chamber. Due to dimensional limitation, there is almost no space for moving between the parts and components. The line installation is troublesome. Disassembly of parts and components are troublesome with other parts and components having to be removed first. A space for weights is reserved.

Comparing with the existing technology, the said miniaturized forklift fuel cell supply system has the following beneficial effects:

1) The energy storage device placed by the existing technology in the system is small in capacity, making the energy storage device be in a charging and discharging condition with a high multiplying factor and reducing the service life of the energy storage device. The said miniaturized forklift fuel cell supply system can contain an energy storage device with a higher capacity, making the energy storage device be in a charging and discharging condition with a low multiplying factor and extending the service life of the energy storage device and the time for which the system can be left unused. For example, in the circumstance that what is placed in the energy storage device is a lithium ion battery, the lithium ion battery placed as designed by the existing technology has a capacity 32 AH, a peak output 10 KW. The lithium ion battery that can be placed in the said miniaturized forklift fuel cell supply system has a capacity 50 AH, a peak output 15 KW. When absorbing the forklift braking at 600 A, the charging multiplying factor is 12 C. That value in the existing technology is 18 C. A higher energy storage device capacity reduces the charging and discharging multiplying factor at the same current output and favors extension of battery service life.

2) The said miniaturized forklift fuel cell supply system is compact in structure and facilitates such work as system installation, overhaul and maintenance, etc.

3) In the enclosure, the operation control unit, controller are placed on the top. In the circumstance when they are not used by the system and moved outside forklift, inspection and maintenance, failure recovery can be made. The controller control software upgrading is also facilitated.

4) Spaces are reserved between parts and components, parts and components and enclosure, which facilitates line connection, part and component removal.

5) The compact structural design of the said miniaturized forklift fuel cell supply system allows placing of the emergency stop button. In case of any emergency, the whole system can be disconnected quickly.

6) Such components as ON and OFF button, emergency stop button, filling valve, etc. required by system operation are placed at appropriate heights to facilitate filling, operation.

More specifically, The said miniaturized forklift fuel cell supply system consists of enclosure 90 and the fuel cell system 100 provided in the said enclosure 90, DCDC converting unit 2, contactor 3, energy storage device 4, controller 7, which also includes the power supply output end 5 provided outside the said enclosure 90 and the operation control unit 6 provided in the said enclosure 90, in which, the said contactor 3 is a normal open type high-current contactor, the said DCDC converting unit 2 includes the DCDC converter 21 and high-power diode 22 connecting with it, The said fuel cell system 100 connects the said DCDC converting unit 2, contactor 3, power supply output end 5, the said controller 7 connects the said fuel cell system 100, operation control unit 6, contactor 3, the said energy storage device 4 connects the said controller 7, operation control unit 6 and contactor 3, The said fuel cell system 100, energy storage device 4 are provided in proper order on the electric isolation board 901 of the said enclosure 90 along the said enclosure 90 in a direction from front to back, the said DCDC converting unit 2 is located right above the said energy storage device 4, the said operation control unit 6 and controller 7 are located right above the said DCDC converting unit 2. The said controller 7 and operation control unit 6 are installed in proper order along the said enclosure 90 in a direction from front to back. The said contactor 3 is installed in the area between the side board of the said enclosure 90 and the said operation control unit 6.

In a preferable case, the said miniaturized forklift fuel cell supply system also consists of the hydrogen storage system, filling valve 95 provided in the said enclosure 90, the said electric isolation board 901 divides the space of the said enclosure 90 into an electronic system space and a gas supply space, the said fuel cell system 100, DCDC converting unit 2, contactor 3, energy storage device 4, controller 7, operation control unit 6, filling valve 95 are located in the said electronic system space, the said hydrogen storage system is located in the said gas supply space, the said gas supply space is located at the lower part of the said electronic system space.

The said fuel cell system 100 consists of fuel cell 1 and auxiliary system 8. The said auxiliary system 8 consists of air supply system, cooling system, hydrogen system, the said high-power auxiliary component 80 refers to a high-power component in the auxiliary system (for example fan, pump, heat dissipation fan). The technical people in this field can refer to the existing technology to accomplish the said auxiliary system 8 and its high-power auxiliary component 80. No unnecessary detail is to be given here.

FIG. 21 and FIG. 22 show the fuel cell supply systems in the two embodiments of the said miniaturized forklift fuel cell supply system. Specifically, FIG. 21 shows embodiment C-1: an electric piling forklift from a forklift plant uses 24V lead-acid battery voltage. That lead-acid battery is 920 mm long, 361 mm wide, 787 mm high, weighs 702 kg with a voltage 24V. The working voltage range of the forklift is 20-30V. The system is designed to be 920 mm long, 360 mm wide, 786 mm high, weigh 702 Kg with a rated system voltage 20-30V. FIG. 22 shows embodiment C-2: a standing-steer type pallet-carrying forklift from a forklift plant uses 24V lead-acid battery, which is 790 mm long, 330 mm wide, 784 mm high and weighs 300 kg. The working voltage range of the forklift is 20-30V. The system is designed to be 780 mm long, 325 mm wide, 780 mm high, weigh 300 Kg with a rated system voltage 20-30V.

The reason that a compact structure as shown in FIG. 20 can be designed for the said miniaturized forklift fuel cell supply system is mainly due to adopting the compact type fuel cell supply system as shown in FIG. 1.

The embodiment examples of this invention are described above. What needs understanding is that that this invention is not limited to above specific embodiments. The technical people in this field can make various variations or modifications with the Claim, and this does not influence the essential contents of this invention.

The invention claimed is:

1. A fuel cell mixed power supply energy management method implemented with a processor and memory includes the following steps:

Step S201: Initialize, specifically, obtain the following parameter values first:

The first current setting of DCDC Isetmin,

The first voltage setting of energy storage device Umax,

The second voltage setting of energy storage device Umin,

The permissible DCDC current deviation value Ipermissible,

The maximum current setting that DCDC allows to output Imax,

Then let the current setting of DCDC Iset equal to the said first current setting of DCDC Isetmin;

Step S202: Obtain the energy storage device voltage Ustorage and the actual output current of DCDC converting unit Idcdc, calculate according to the following formula (1) DCDC current deviation value Ideviation:

$$Ideviation = Iset - Idcdc \quad \text{Formula (1)};$$

Step S203: in case of meeting the following circumstances, enter into Step S204, Step S205 or Step S206:

If the energy storage device voltage Ustorage is greater than or equal to the first voltage setting of energy storage device Umax, then enter into Step S204, If the energy storage device voltage Ustorage is less than or equal to the first voltage setting of energy storage device Umin, then enter into Step S205, If the energy storage device voltage Ustorage is less than the first voltage setting of energy storage device Umax and greater than the first voltage setting of energy storage device Umin, and the DCDC current deviation value Ideviation is greater than or equal to the permissible DCDC current deviation value Ipermissible, then enter into Step S206, If the energy storage device voltage Ustorage is less than the first voltage setting of energy storage device Umax and greater than the first voltage setting of energy storage device Umin, and the DCDC current deviation value Ideviation is less than the permissible DCDC current deviation value Ipermissible, then enter into Step S207;

Step S204: If the current setting of DCDC Iset is greater than the first current setting of DCDC Isetmin, then gradually reduce the current setting of DCDC Iset, and then enter into Step S207; if the current setting of DCDC Iset is less than or equal to the first current setting of DCDC Isetmin, then let the current setting of DCDC Iset is equal to the said first current setting of DCDC Isetmin and then enter into Step S207;

Step S205: If the current setting of DCDC Iset is less than the maximum current setting that DCDC allows to output Imax, increase the current setting of DCDC Iset and then enter into Step S207; if the current setting of DCDC Iset is greater than or equal to the maximum current setting that DCDC allows to output Imax, let the current setting of DCDC Iset equal to the maximum current setting that DCDC allows to output Imax and then enter into Step S207;

Step S206: If the current setting of DCDC Iset is greater than the first current setting of DCDC Isetmin, reduce at a fastest speed the current setting of DCDC Iset and then enter into Step S207; if the current setting of DCDC Iset is less than or equal to the first current setting of DCDC Isetmin, let the current setting of DCDC Iset equal to the said first current setting of DCDC Isetmin and then enter into Step S207;

Step S207: Send a current setting instruction to DCDC converting unit, in which the said current setting instruction is used to set the output current of the DCDC converting unit as the current setting of DCDC Iset and then return to Step S202.

2. According to claim 1, before the said Step S201, the following steps executed in proper order are also included:

Step A1: Determine the limit voltage Ulim, specifically, judge if the highest limit of load protection voltage is greater than the charging protection voltage of the energy storage device; if the judgment result is positive, set the limit voltage Ulimit as equal to the charging protection voltage of the energy storage device; if the judgment result is negative, set the limit voltage Ulimit as equal to the highest limit of load protection voltage;

Step A2: Determine the expected DCDC converting unit output current Iexpect according to the following formula (2):

$$Iexpect = \frac{Irated \cdot Edcdc}{Ulim}, \quad \text{Formula (2)}$$

Where Irated is the rated output power of the fuel cell, Edcdc is the efficiency of the DCDC converting unit;

Step A3:

On the current curve using expected DCDC converting unit output current as a constant charging value, obtain the corresponding charging capacity as 50%-90% of the voltage interval, select any voltage value in the voltage interval as the first voltage setting of energy storage device Umax.

3. According to claim 1, in the said Step A3, from the corresponding charging capacity being any voltage value or voltage interval below, set the said voltage value as or select any voltage value in the said voltage interval as the first voltage setting of energy storage device Umax:

The corresponding charging capacity is the voltage value at 90%, determine the voltage value at the said 90% as the first voltage setting of energy storage device Umax, The corresponding charging capacity is 60%-80% voltage interval, select any voltage value in the said 60%-80% voltage interval to be determined as the first voltage setting of energy storage device Umax, The corresponding charging capacity is 80%-90% voltage interval, select any voltage value in the said 80%-90% voltage interval to be determined as the first voltage setting of energy storage device Umax, The corresponding charging capacity is 50%-60% voltage interval, select any voltage value in the said 50%-60% voltage interval to be determined as the first voltage setting of energy storage device Umax.

4. According to claim 1, before the said Step S201, the following steps executed in proper order are also included:

Step B1: Determine the system limit charging current, specifically,

Under the working condition in which the system uses medium limit energy recovery, first use battery to make a braking action and obtain the system current, time data from braking to the end, the negative current of that system is the charging current, calculate the average of that charging current as the system limit charging current;

Step B2: Determine the limit voltage Ulim, specifically, judge if the highest limit of load protection voltage is greater than the charging protection voltage of the energy storage device; if the judgment result is positive, set the limit voltage Ulimit as equal to the charging protection voltage of the energy storage device; if the judgment result is negative, set the limit voltage Ulimit as equal to the highest limit of load protection voltage;

Step B3: Determine the expected DCDC converting unit output current Iexpect according to the following formula (2):

$$I\text{expect} = \frac{I\text{rated} \cdot E\text{dcdc}}{U\text{lim}}, \quad \text{Formula (2)}$$

Where Irated is the rated output of the fuel cell, Edcdc is the efficiency of the DCDC converting unit;

Step B4: Inquire the testing curves of different charging currents and charging capacitances; according to the constant current charging curve that the system limit charging current corresponds to, obtain the corresponding charging capacitance when charging to the limit voltage; according to that charging capacity, look up the corresponding voltage value on the constant current charging curve that the expected DCDC converting unit output current Iexpect corresponds to, the said corresponding voltage value is the first voltage setting of energy storage device Umax;

Step B5: According to the energy recovery working condition when the system uses time limit, do actual testing by using the system controlled by the first voltage setting of energy storage device Umax, correct the first voltage setting of energy storage device Umax so that the actually measured highest voltage is slightly lower than the limit voltage Ulim;

Step B6: Correct the capacity of the energy storage device, specifically, according to the relational curve between energy storage device charging capacity/rated capacity and cycle times, or the relational curve between the discharging capacity/rated capacity and cycle times, inquire the charging capacity/rated capacity ratio after multiple cycles, and then take the product of the first voltage setting of energy storage device Umax and the charging capacity/rated capacity ratio as the corrected first voltage setting of energy storage device Umax.

5. According to claim 1, before the said Step S201, the following steps executed in proper order are also included:

Step C1: Determine the minimum consumption current of the auxiliary system Is, specifically, use the system controlled by the first voltage setting of energy storage device Umax to have the system be in an idle condition, after the system becomes stable, the consumption of the auxiliary system reduces to the minimum, measure the current of the auxiliary system at this time, which is the minimum consumption current;

Step C2: take the product of the minimum consumption current of the auxiliary system and the coefficient K as the first current setting of DCDC Isetmin, where the coefficient K is less than 1.

6. According to claim 1, the coefficient K is 0.6.

7. According to claim 1, before the said Step S201, the following steps executed in proper order are also included:

Step D1: Determine according to the follow formula (3) the maximum current setting that DCDC allows to output Imax:

$$I\max = \frac{I\text{rated} \cdot E\text{dcdc}}{U\max}. \quad \text{Formula (3)}$$

8. According to claim 1, before the said Step S201, the following steps executed in proper order are also included:

Step E1: Determine according to the following formula (4) the capacitance at the minimum load Cmin:

$$C_{min} = C - (Is - I_{set\,min}) \cdot T \quad \text{Formula (4)}$$

Where, C is the charging capacity, Is is the minimum consumption current of the auxiliary system, T is time, the said charging capacity is the charging capacity that the first voltage setting of energy storage device Umax corresponds to inquired on the charging capacity and charging voltage curve with constant current charging taking the maximum current setting that DCDC allows to output Imax as the current, the said time is set according to the response speed that the system requires;

Step E2: According to the capacitance at minimum load Cmin, inquire the charging voltage that the capacitance at the minimum load Cmin corresponds to on the charging capacity and charging voltage curve with constant current charging taking the maximum current setting that DCDC allows to output Imax as the current, select that charging voltage as the second voltage setting of energy storage device Umin.

* * * * *